US012796547B2

(12) United States Patent
Jee et al.

(10) Patent No.: US 12,796,547 B2
(45) Date of Patent: Nov. 10, 2026

(54) SEMICONDUCTOR PACKAGE AND METHOD FOR FABRICATING THE SAME

(71) Applicant: SAMSUNG ELECTRONICS CO., LTD., Suwon-si (KR)

(72) Inventors: Young Kun Jee, Suwon-si (KR); Un-Byoung Kang, Suwon-si (KR); Jum Yong Park, Suwon-si (KR); Jong-Hyeon Chang, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 478 days.

(21) Appl. No.: 18/217,701

(22) Filed: Jul. 3, 2023

(65) Prior Publication Data

US 2024/0014177 A1 Jan. 11, 2024

(30) Foreign Application Priority Data

Jul. 8, 2022 (KR) ........................ 10-2022-0084520
Oct. 7, 2022 (KR) ........................ 10-2022-0128607

(51) Int. Cl.
*H10W 90/00* (2026.01)
*H10W 20/00* (2026.01)
(Continued)

(52) U.S. Cl.
CPC ......... *H10W 90/00* (2026.01); *H10W 20/023* (2026.01); *H10W 20/20* (2026.01);
(Continued)

(58) Field of Classification Search
CPC ... H10W 90/00; H10W 20/20; H10W 20/023; H10W 70/09; H10W 70/60; H10W 90/297; H10W 90/722
See application file for complete search history.

(56) References Cited

U.S. PATENT DOCUMENTS 8,378,480 B2 2/2013 Chen et al.
10,861,808 B2 12/2020 Chen et al.
(Continued)

FOREIGN PATENT DOCUMENTS

CN 114203563 3/2022
KR 10-2021-0142465 A 11/2021

OTHER PUBLICATIONS

Office Action dated May 14, 2026 issued in the corresponding Korean Patent Application No. 10-2022-0128607. (Note: US2020/0135699A, CN114203563A, and US2021/0320058A already submitted).

*Primary Examiner* — Jay C Kim
*Assistant Examiner* — Woo K Lee
(74) *Attorney, Agent, or Firm* — MORGAN, LEWIS & BOCKIUS LLP

(57) ABSTRACT

A semiconductor package includes a redistribution substrate. A first semiconductor chip is disposed on the redistribution substrate. The first semiconductor chip includes a first semiconductor substrate, first through vias penetrating through the first semiconductor substrate, and a first bonding layer disposed on the first semiconductor substrate. The first bonding layer is electrically connected to the first through vias. A second semiconductor chip includes a second semiconductor substrate and a second bonding layer disposed on the second semiconductor substrate. The second bonding layer is bonded to the first bonding layer. A filling insulating film is disposed on the redistribution substrate. The filling insulating film covers the first semiconductor chip and the second semiconductor chip. An upper surface of the filling insulating film is disposed on a level above an upper surface of the first semiconductor chip and an upper surface of the second semiconductor chip.

15 Claims, 15 Drawing Sheets

(51) Int. Cl.
*H10W 20/20* (2026.01)
*H10W 70/09* (2026.01)
*H10W 70/60* (2026.01)
*H10W 90/20* (2026.01)

(52) U.S. Cl.
CPC ............ *H10W 70/09* (2026.01); *H10W 70/60* (2026.01); *H10W 90/297* (2026.01); *H10W 90/722* (2026.01)

(56) References Cited

U.S. PATENT DOCUMENTS

| | | | | |
|---|---|---|---|---|
| 10,867,879 | B2 | 12/2020 | Yu et al. | |
| 10,867,885 | B2 | 12/2020 | Yu et al. | |
| 2020/0135699 | A1* | 4/2020 | Hwang | H10W 20/023 |
| 2020/0343218 | A1* | 10/2020 | Hu | H10W 90/00 |
| 2021/0320058 | A1* | 10/2021 | Kang | H10W 42/121 |
| 2021/0358875 | A1 | 11/2021 | Lee et al. | |
| 2021/0358894 | A1 | 11/2021 | Gu et al. | |

* cited by examiner

SEMICONDUCTOR PACKAGE AND METHOD FOR FABRICATING THE SAME

CROSS-REFERENCE TO RELATED APPLICATION

This application claims priority under 35 U.S.C § 119 to Korean Patent Application No. 10-2022-0084520, filed on Jul. 8, 2022 in the Korean Intellectual Property Office (KIPO) and Korean Patent Application No. 10-2022-0128607, filed on Oct. 7, 2022 in KIPO, the disclosures of which are incorporated by reference in their entireties herein.

1. TECHNICAL FIELD

The present disclosure relates to a semiconductor package and a method for fabricating the same.

2. DISCUSSION OF RELATED ART

Semiconductor packages have been developed to efficiently fabricate semiconductor chips having greater functions and an increased reliability. A stacked semiconductor package having a plurality of semiconductor chips that are stacked is under development to mount more semiconductor chips in a same area.

Such a semiconductor package may have a structure in which different types of semiconductor chips are stacked in a vertical direction. Research has been conducted to develop semiconductor packages in which semiconductor chips including through silicon vias (TSVs) are stacked in the vertical direction to implement such a structure.

SUMMARY

Aspects of embodiments of the present disclosure provide a semiconductor package capable of being fabricated at a relatively low cost by covering a first semiconductor chip and a second semiconductor chip with a single filling insulating film.

Aspects of embodiments of the present disclosure also provide a method for fabricating a semiconductor package capable of being fabricated at a relatively low cost by covering a first semiconductor chip and a second semiconductor chip with a single filling insulating film.

However, aspects of embodiments of the present disclosure are not restricted to those set forth herein. The above and other aspects of embodiments of the present disclosure will become more apparent to one of ordinary skill in the art to which the present disclosure pertains by referencing the detailed description of embodiments of the present disclosure.

According to an embodiment of the present disclosure, a semiconductor package includes a redistribution substrate. A first semiconductor chip is disposed on the redistribution substrate. The first semiconductor chip includes a first semiconductor substrate, first through vias penetrating through the first semiconductor substrate, and a first bonding layer disposed on the first semiconductor substrate. The first bonding layer is electrically connected to the first through vias. A second semiconductor chip includes a second semiconductor substrate and a second bonding layer disposed on the second semiconductor substrate. The second bonding layer is bonded to the first bonding layer. A filling insulating film is disposed on the redistribution substrate. The filling insulating film covers the first semiconductor chip and the second semiconductor chip. An upper surface of the filling insulating film is disposed on a level above an upper surface of the first semiconductor chip and an upper surface of the second semiconductor chip.

According to an embodiment of the present disclosure, a semiconductor package includes a redistribution substrate. A first semiconductor chip is disposed on the redistribution substrate. The first semiconductor chip includes a first semiconductor substrate, first through vias penetrating through the first semiconductor substrate, and a first bonding layer disposed on the first semiconductor substrate. The first bonding layer is electrically connected to the first through vias. A first-first dummy chip and a first-second dummy chip are disposed on the first semiconductor chip. The first-first dummy chip and the first-second dummy chip are spaced apart from each other. A first dummy bonding insulating film is disposed between the first semiconductor chip and the first-first dummy chip and between the first semiconductor chip and the first-second dummy chip. The first dummy bonding insulating film is bonded to the first bonding layer. A second semiconductor chip is disposed on the first semiconductor chip. The second semiconductor chip is positioned between the first-first dummy chip and the first-second dummy chip. The second semiconductor chip includes a second semiconductor substrate and a second bonding layer disposed on the second semiconductor substrate. The second bonding layer is bonded to the first bonding layer. A filling insulating film is disposed on the redistribution substrate. The filling insulating film covers the first semiconductor chip, the first-first dummy chip, the first-second dummy chip, and the second semiconductor chip. An upper surface of the filling insulating film is disposed on a level above an upper surface of the first semiconductor chip, an upper surface of the first-first dummy chip, an upper surface of the first-second dummy chip, and an upper surface of the second semiconductor chip. An entirety of the first-first dummy chip and an entirety of the first-second dummy chip overlap the first semiconductor chip in a direction from the first semiconductor chip towards the second semiconductor chip.

According to an embodiment of the present disclosure, a method for fabricating a semiconductor package includes forming a substrate bonding layer on a carrier. The substrate bonding layer and a first semiconductor chip are bonded to each other. A first-first bonding layer of the first semiconductor chip is bonded to the substrate bonding layer. The first semiconductor chip and a second semiconductor chip are bonded to each other. A second bonding layer of the second semiconductor chip is bonded to a first-second bonding layer of the first semiconductor chip. A filling insulating film is formed on the substrate bonding layer. The filling insulating film covers the first semiconductor chip and the second semiconductor chip.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF EMBODIMENTS

Figure 1:
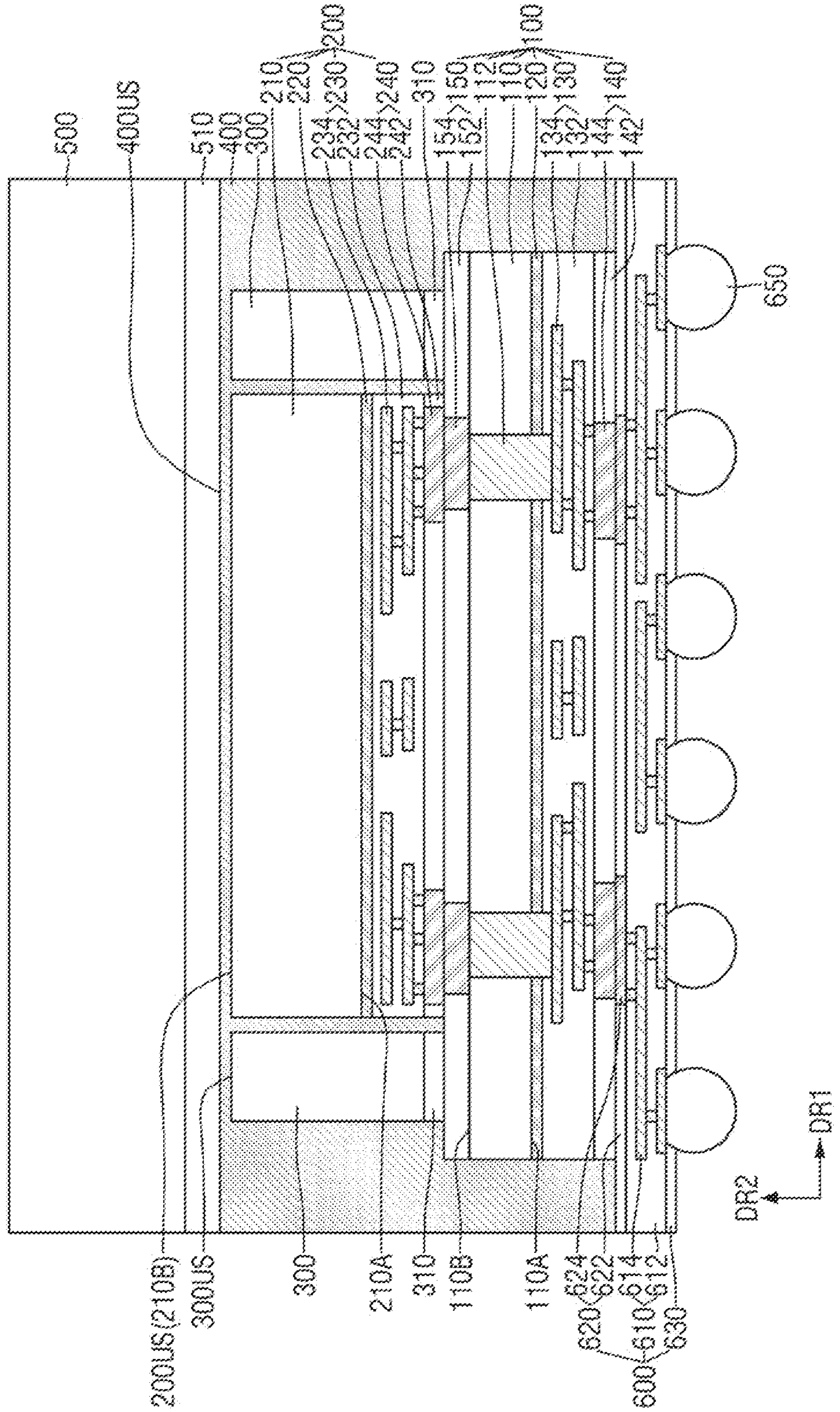
FIG. 1 is a cross-sectional view for describing a semiconductor package according to some embodiments.

FIG. 1 is a view for describing a semiconductor package according to some embodiments.

Referring to FIG. 1, a semiconductor package according to some embodiments may include a first semiconductor chip 100, a second semiconductor chip 200, first dummy chips 300, a first dummy bonding insulating film 310, a filling insulating film 400, a second dummy chip 500, a second dummy bonding insulating film 510, a redistribution substrate 600, and connection terminals 650.

The first semiconductor chip 100 may include a first semiconductor substrate 110, a first semiconductor element layer 120, a first chip wiring layer 130, a first-first bonding layer 140, and a first-second bonding layer 150.

The first semiconductor substrate 110 may include a first surface 110A and a second surface 110B opposing each other. The first surface 110A and the second surface 110B may oppose each other in a second direction DR2 that is a thickness direction of the semiconductor package. Based on the second direction DR2, the first surface 110A may be a lower surface of the first semiconductor substrate 110, and the second surface 110B may be an upper surface of the first semiconductor substrate 110. In the following description, the upper and lower surfaces and upper and lower surfaces may be based on the second direction DR2 for convenience of explanation.

In an embodiment, the first semiconductor substrate 110 may be, for example, bulk silicon or silicon-on-insulator (SOI). The first semiconductor substrate 110 may be a silicon substrate or may include other materials, for example, silicon germanium, indium antimonide, a lead tellurium compound, indium arsenide, indium phosphide, gallium arsenide, or gallium antimonide. However, embodiments of the present disclosure are not necessarily limited thereto. For example, in an embodiment the first semiconductor substrate 110 may be a substrate in which an epitaxial layer is formed on a base substrate.

The first semiconductor element layer 120 may be disposed on (e.g., disposed directly thereon) the first surface 110A of the first semiconductor substrate 110. In an embodiment, the first semiconductor element layer 120 may include various microelectronic elements, for example, a metal-oxide-semiconductor field effect transistor (MOSFET) such as a complementary metal-oxide-semiconductor (CMOS) transistor, a system large scale integration (LSI), a flash memory, a dynamic random access memory (DRAM), a static random access memory (SRAM), an electrically erasable programmable read-only memory (EEPROM), a phase-change random access memory (PRAM), a magnetoresistive random access memory (MRAM), a resistive random access memory (RERAM), an image sensor such as a CMOS imaging sensor (CIS), a micro-electro-mechanical system (MEMS), an active element, and a passive element.

The first chip wiring layer 130 may be disposed on (e.g., disposed directly thereon) the first semiconductor element layer 120. The first chip wiring layer 130 may include, for example, a first chip insulating film 132 disposed on (e.g., disposed directly thereon) the first semiconductor element layer 120 and first chip wiring patterns 134 disposed in the first chip insulating film 132. The first chip wiring patterns 134 may include wiring layers having a multilayer structure and vias connecting the wiring layers to each other. An arrangement, the number of layers, and the number of first chip wiring patterns 134 shown in FIG. 1 are only examples and embodiments of the present disclosure are not necessarily limited thereto. The first semiconductor element layer 120 may be electrically connected to the first chip wiring patterns 134. The first chip wiring layer 130 may be electrically connected to the first semiconductor element layer 120.

In an embodiment, the first chip wiring pattern 134 may include, for example, a conductive film and a barrier film interposed between the conductive film and the first chip insulating film 132. In an embodiment, the conductive film of the first chip wiring pattern 134 may include, for example, at least one compound selected from tungsten (W), aluminum (Al), and copper (Cu). However, embodiments of the present disclosure are not necessarily limited thereto. In an embodiment, the barrier film of the first chip wiring pattern 134 may include, for example, at least one compound selected from titanium (Ti), titanium nitride (TiN), tantalum (Ta), and tantalum nitride (TaN). However, embodiments of the present disclosure are not necessarily limited thereto.

The first-first bonding layer 140 may be disposed on (e.g., disposed directly thereon) the first chip wiring layer 130. The first-first bonding layer 140 may include, for example, a first-first bonding insulating film 142 and first-first bonding pads 144 disposed in the first-first bonding insulating film 142. The first-first bonding pads 144 may be in direct contact with first chip wiring patterns 134 disposed at the lowermost portion among the first chip wiring patterns 134. Accordingly, the first-first bonding pads 144 may be electrically connected to the first chip wiring layer 130 and the first semiconductor element layer 120.

In an embodiment, the first-first bonding pad 144 may include a metal, for example, copper (Cu), aluminum (Al), or tungsten (W). However, embodiments of the present disclosure are not necessarily limited thereto. The first-first bonding insulating film 142 may include an insulating material, for example, at least one compound selected from SiO, SiN, SiCN, SiOC, SiON, and SiOCN. However, embodiments of the present disclosure are not necessarily limited thereto.

First through vias 112 may penetrate through the first semiconductor substrate 110 and the first semiconductor element layer 120. For example, the first through vias 112 may be in direct contact with first chip wiring patterns 134 disposed at the uppermost portion among the first chip wiring patterns 134. Accordingly, the first through vias 112 may be electrically connected to the first semiconductor chip 100.

In an embodiment, the first through via 112 may include, for example, a conductive film penetrating through the first semiconductor substrate 110 and having a pillar shape and a barrier film interposed between the conductive film and the first semiconductor substrate 110. In an embodiment, the conductive film of the first through via 112 may include, for example, at least one of Cu alloys such as Cu, CuSn, CuMg, CuNi, CuZn, CuPd, CuAu, CuRe, and CuW, W, W alloys, Ni, Ru, and Co. However, embodiments of the present disclosure are not necessarily limited thereto. In an embodiment, the barrier film of the first through via 112 may be, for example, at least one compound selected from titanium (Ti), titanium nitride (TiN), tantalum (Ta), tantalum nitride (TaN), rubidium (Ru), cobalt (Co), manganese (Mn), tungsten nitride (WN), nickel (Ni), and nickel boride (NiB). However, embodiments of the present disclosure are not necessarily limited thereto.

The first through via 112 may further include, for example, an insulating film interposed between the barrier film and the first semiconductor substrate 110. In an embodiment, the insulating film of the first through via 112 may include, for example, at least one material selected from an oxide film, a nitride film, a carbide film, a polymer, or combinations thereof. However, embodiments of the present disclosure are not necessarily limited thereto.

The first-second bonding layer 150 may be disposed on (e.g., disposed directly thereon) the second surface 110B of the first semiconductor substrate 110. The first-second bonding layer 150 may include, for example, a first-second bonding insulating film 152 and first-second bonding pads 154 disposed in the first-second bonding insulating film 152. The first-second bonding pads 154 may be in direct contact with the first through vias 112 and may be electrically connected to the first through vias 112. Accordingly, the first-second bonding pads 154 may be electrically connected to the first semiconductor chip 100.

In an embodiment, the first-second bonding pad 154 may include a metal, for example, copper (Cu), aluminum (Al), or tungsten (W). However, embodiments of the present disclosure are not necessarily limited thereto. The first-second bonding insulating film 152 may include an insulating material, for example, at least one compound selected from SiO, SiN, SiCN, SiOC, SiON, and SiOCN. However, embodiments of the present disclosure are not necessarily limited thereto.

The second semiconductor chip 200 may be disposed on (e.g., disposed directly thereon) the first semiconductor chip 100. The second semiconductor chip 200 may include a second semiconductor substrate 210, a second semiconductor element layer 220, a second chip wiring layer 230, and a second-first bonding layer 240.

The second semiconductor substrate 210 may include a third surface 210A and a fourth surface 210B opposing each other. The third surface 210A and the fourth surface 210B may oppose each other in the second direction DR2. The third surface 210A may be a lower surface of the second semiconductor substrate 210, and the fourth surface 210B may be an upper surface of the second semiconductor substrate 210. The third surface 210A of the second semiconductor substrate 210 may face the second surface 110B of the first semiconductor substrate 110.

In an embodiment, the second semiconductor substrate 210 may be, for example, bulk silicon or silicon-on-insulator (SOI). The second semiconductor substrate 210 may be a silicon substrate or may include other materials, for example, silicon germanium, indium antimonide, a lead tellurium compound, indium arsenide, indium phosphide, gallium arsenide, or gallium antimonide. However, embodiments of the present disclosure are not necessarily limited thereto. For example, in an embodiment the second semiconductor substrate 210 may be a substrate in which an epitaxial layer is formed on a base substrate.

The second semiconductor element layer 220 may be disposed on (e.g., disposed directly thereon) the third surface 210A of the second semiconductor substrate 210. In an embodiment, the second semiconductor element layer 220 may include various microelectronic elements, for example, a metal-oxide-semiconductor field effect transistor (MOSFET) such as a complementary metal-oxide-semiconductor (CMOS) transistor), a system large scale integration (LSI), a flash memory, a dynamic random access memory (DRAM), a static random access memory (SRAM), an electrically erasable programmable read-only memory (EEPROM), a phase-change random access memory (PRAM), a magnetoresistive random access memory (MRAM), a resistive random access memory (RERAM), an image sensor such as a CMOS imaging sensor (CIS), a micro-electromechanical system (MEMS), an active element, and a passive element.

The second chip wiring layer 230 may be disposed on (e.g., disposed directly thereon) the second semiconductor element layer 220. The second chip wiring layer 230 may include, for example, a second chip insulating film 232 disposed on (e.g., disposed directly thereon) the second semiconductor element layer 220 and second chip wiring patterns 234 disposed in the second chip insulating film 232. The second chip wiring patterns 234 may include wiring layers having a multilayer structure and vias connecting the wiring layers to each other. An arrangement, the number of layers, and the number of second chip wiring patterns 234 shown in FIG. 1 are only examples and embodiments of the present disclosure are not necessarily limited thereto. The second semiconductor element layer 220 may be electrically connected to the second chip wiring patterns 234. The second chip wiring layer 230 may be electrically connected to the second semiconductor element layer 220.

The second chip wiring pattern 234 may include, for example, a conductive film and a barrier film interposed between the conductive film and the second chip insulating film 232. In an embodiment, the conductive film of the second chip wiring pattern 234 may include, for example, at least one compound selected from tungsten (W), aluminum (Al), and copper (Cu). However, embodiments of the present disclosure are not necessarily limited thereto. In an embodiment, the barrier film of the second chip wiring pattern 234 may include, for example, at least one compound selected from titanium (Ti), titanium nitride (TiN), tantalum (Ta), and tantalum nitride (TaN). However, embodiments of the present disclosure are not necessarily limited thereto.

The second-first bonding layer 240 may be disposed on (e.g., disposed directly thereon) the second chip wiring layer 230. The second-first bonding layer 240 may include, for example, a second-first bonding insulating film 242 and second-first bonding pads 244 disposed in the second-first bonding insulating film 242. The second-first bonding pads 244 may be in direct contact with second chip wiring patterns 234 disposed at the lowermost portion among the second chip wiring patterns 234. Accordingly, the second-first bonding pads 244 may be electrically connected to the second chip wiring layer 230 and the second semiconductor element layer 220.

In an embodiment, the second-first bonding pad 244 may include a metal, for example, copper (Cu), aluminum (Al), or tungsten (W). However, embodiments of the present disclosure are not necessarily limited thereto. In an embodiment, the second-first bonding insulating film 242 may include an insulating material, for example, at least one compound selected from SiO, SiN, SiCN, SiOC, SiON, and SiOCN. However, embodiments of the present disclosure are not necessarily limited thereto.

The second-first bonding layer 240 may be bonded to the first-second bonding layer 150. The first semiconductor chip 100 may be electrically connected to the second semiconductor chip 200.

In an embodiment, the first-second bonding layer 150 and the second-first bonding layer 240 may be bonded to each other by a hybrid bonding method, such as a metal-oxide hybrid bonding method. For example, the second-first bonding pads 244 may be attached to the first-second bonding pads 154, and the second-first bonding insulating film 242 may be attached to the first-second bonding insulating film

152. For example, in an embodiment the first-second bonding pads 154 and the second-first bonding pads 244 may be bonded to each other by a copper (Cu)-copper (Cu) bonding method, and the first-second bonding insulating film 152 and the second-first bonding insulating film 242 may be bonded to each other by a dielectric-dielectric bonding method.

In an embodiment, the first semiconductor chip 100 and the second semiconductor chip 200 may be different types of semiconductor chips. For example, in an embodiment the first semiconductor chip 100 may be a logic semiconductor chip, and the second semiconductor chip 200 may be a memory semiconductor chip. The logic semiconductor chip may be, for example, an application processor (AP) such as a central processing unit (CPU), a graphic processing unit (GPU), a field-programmable gate array (FPGA), a digital signal processor, an encryption processor, a microprocessor, a microcontroller, or an application-specific integrated circuit (ASIC). However, embodiments of the present disclosure are not necessarily limited thereto. The memory semiconductor chip may be, for example, a volatile memory such as dynamic random access memory (DRAM) or static random access memory (SRAM), or a non-volatile memory such as a flash memory, a phase-change random access memory (PRAM), a magnetoresistive random access memory (MRAM), a ferroelectric random access memory (FeRAM), or a resistive random access memory (RRAM). However, embodiments of the present disclosure are not necessarily limited thereto.

The first dummy chips 300 may be disposed on the first semiconductor chip 100. The first dummy chip 300 may be a semiconductor substrate that does not include a circuit layer. In an embodiment, the first dummy chip 300 may be, for example, bulk silicon or silicon-on-insulator (SOI). In an embodiment, the first dummy chip 300 may be a silicon substrate or may include other materials, for example, silicon germanium, indium antimonide, a lead tellurium compound, indium arsenide, indium phosphide, gallium arsenide, or gallium antimonide. However, embodiments of the present disclosure are not necessarily limited thereto. For example, in an embodiment the first dummy chip 300 may be a substrate in which an epitaxial layer is formed on a base substrate.

The first dummy bonding insulating film 310 may be disposed between the first dummy chips 300 and the first semiconductor chip 100 (e.g., in the second direction DR2). The first dummy bonding insulating film 310 may be disposed between the first dummy chips 300 and the first-second bonding layer 150 (e.g., in the second direction DR2). For example, the first dummy bonding insulating film 310 may be disposed under (e.g., therebeneath) the first dummy chips 300 and above the first-second bonding layer 150. In an embodiment, the first dummy bonding insulating film 310 may include an insulating material, for example, at least one compound selected from SiO, SiN, SiCN, SiOC, SiON, and SiOCN. However, embodiments of the present disclosure are not necessarily limited thereto.

The first dummy bonding insulating film 310 may be bonded to the first-second bonding layer 150. For example, the first dummy bonding insulating film 310 may be attached to the first-second bonding insulating film 152. For example, in an embodiment the first dummy bonding insulating film 310 and the first-second bonding insulating film 152 may be bonded to each other by a dielectric-dielectric bonding method. The first dummy bonding insulating film 310 may also be bonded to the filling insulating film 400.

The first dummy chips 300 may be spaced apart from the second semiconductor chip 200. For example, in an embodiment the first dummy chips 300 may be disposed around the second semiconductor chip 200 (e.g., in the first direction DR1). For example, the first dummy chips 300 may be disposed on both sidewalls of the second semiconductor chip 200. For example, the second semiconductor chip 200 may be disposed between the first dummy chips 300 adjacent to each other in a first direction DR1. The number of first dummy chips 300 shown in FIG. 1 is only an example, and embodiments of the present disclosure are not necessarily limited thereto. In addition, in some embodiments heights of the first dummy chips 300 (e.g., thicknesses of the first dummy chips 300 in the second direction DR2) may be different from each other.

In an embodiment, the entirety of the first dummy chip 300 may overlap the first semiconductor chip 100 in the second direction DR2 which is a direction from the first semiconductor chip 100 towards the second semiconductor chip 200. In the semiconductor package according to some embodiments, one sidewall of the first dummy chip 300 may be disposed on a different plane from one sidewall of the first semiconductor chip 100. For example, one sidewall of the first dummy chip 300 may not be aligned with one sidewall of the first semiconductor chip 100 (e.g., in the second direction DR2). Sidewalls of the first dummy chip 300 may be disposed on the first semiconductor chip 100. For example, both sidewalls of the first dummy chip 300 in the first direction DR1 may be disposed on the first semiconductor chip 100. In an embodiment, a thickness of the filling insulating film 400 on the sidewall of the first dummy chip 300 may be greater than a thickness of the filling insulating film 400 on the sidewall of the first semiconductor chip 100. The thickness may be based on the first direction DR1.

In the semiconductor package according to some embodiments, an upper surface 300US of the first dummy chip 300 may be disposed on substantially the same plane as an upper surface 200US of the second semiconductor chip 200. The upper surface 200US of the second semiconductor chip 200 may be the fourth surface 210B of the second semiconductor substrate 210. A thickness (e.g., length in the second direction DR2) of the filling insulating film 400 on the upper surface 300US of the first dummy chip 300 may be substantially the same as a thickness (e.g., length in the second direction DR2) of the filling insulating film 400 on the upper surface 200US of the second semiconductor chip 200.

The redistribution substrate 600 may include a redistribution layer 610, a substrate bonding layer 620, and a passivation layer 630. The first semiconductor chip 100 may be disposed on the redistribution substrate 600.

The redistribution layer 610 may include, for example, a redistribution insulating film 612 and redistribution patterns 614 disposed in the redistribution insulating film 612. The redistribution pattern 614 may include wiring layers having a multilayer structure and vias connecting the wiring layers to each other. An arrangement, the number of layers, and the number of redistribution patterns 614 of the redistribution layer 610 shown in FIG. 1 are only examples and embodiments of the present disclosure are not necessarily limited thereto.

The substrate bonding layer 620 may be disposed on (e.g., disposed directly thereon) the redistribution layer 610. The substrate bonding layer 620 may be disposed on (e.g., disposed directly thereon) an upper surface of the redistribution layer 610. The substrate bonding layer 620 may include, for example, a substrate bonding insulating film 622 and substrate bonding pads 624 disposed in the substrate bonding insulating film 622. The substrate bonding pads 624 may be in direct contact with redistribution patterns 614 disposed at the uppermost portion among the redistribution patterns 614. Accordingly, the substrate bonding pads 624 may be electrically connected to the redistribution layer 610.

In an embodiment, the substrate bonding pad 624 may include a metal, for example, copper (Cu), aluminum (Al), or tungsten (W). However, embodiments of the present disclosure are not necessarily limited thereto. In an embodiment, the substrate bonding insulating film 622 may include an insulating material, for example, at least one compound selected from SiO, SiN, SiCN, SiOC, SiON, and SiOCN. However, embodiments of the present disclosure are not necessarily limited thereto.

The substrate bonding layer 620 may be bonded to the first-first bonding layer 140. The first semiconductor chip 100 may be electrically connected to the redistribution substrate 600.

In an embodiment, the substrate bonding layer 620 and the first-first bonding layer 140 may be bonded to each other by a hybrid bonding method, such as a metal-oxide hybrid bonding method. For example, the substrate bonding pads 624 may be attached to the first-first bonding pads 144, and the substrate bonding insulating film 622 may be attached to the first-first bonding insulating film 142. For example, in an embodiment the substrate bonding pads 624 and the first-first bonding pads 144 may be bonded to each other by a copper (Cu)-copper (Cu) bonding method, and the substrate bonding insulating film 622 and the first-first bonding insulating film 142 may be bonded to each other by a dielectric-dielectric bonding method.

The passivation layer 630 may be disposed on (e.g., disposed directly thereon) the redistribution layer 610. The passivation layer 630 may be disposed on a lower surface of the redistribution layer 610. The passivation layer 630 may expose, for example, at least portions of redistribution patterns 614 disposed at the lowermost portion among the redistribution patterns 614. For example, in an embodiment, the passivation layer 630 may expose a bottom surface of the lowermost portion amongst the redistribution patterns 614.

The connection terminals 650 may be disposed on the redistribution substrate 600. In an embodiment, the connection terminals 650 may be disposed on (e.g., disposed directly thereon) the redistribution patterns 614 exposed by the passivation layer 630. Accordingly, the connection terminals 650 may be electrically connected to the redistribution substrate 600, and the first semiconductor chip 100 and the second semiconductor chip 200 may be electrically connected to an external device (e.g., a panel of an electronic device) through the connection terminals 650.

In an embodiment, the connection terminals 650 may include, for example, solder balls, bumps, under bump metallurgies (UBMs), or the like. In an embodiment, the connection terminal 650 may include a metal such as tin (Sn). However, embodiments of the present disclosure are not necessarily limited thereto.

The filling insulating film 400 may surround the first semiconductor chip 100, the second semiconductor chip 200, and the first dummy chips 300, on the redistribution substrate 600. The filling insulating film 400 may cover the first semiconductor chip 100, the second semiconductor chip 200 and the first dummy chips 300 on the redistribution substrate 600. The filling insulating film 400 may extend along a portion of an upper surface of the redistribution substrate 600, a portion of an upper surface and sidewalls of the first semiconductor chip 100, an upper surface and sidewalls of the second semiconductor chip 200, upper surfaces and sidewalls of the first dummy chips 300, and sidewalls of the first dummy bonding insulating film 310. The filling insulating film 400 may fill spaces between the first dummy chips 300 and the second semiconductor chip 200. For example, the first semiconductor chip 100, the second semiconductor chip 200, and the first dummy chips 300 may be covered by a single filling insulating film 400.

An upper surface 400US of the filling insulating film 400 may be disposed on (e.g., positioned on) a level above the upper surface of the first semiconductor chip 100, the upper surface 300US of the first dummy chip 300, and the upper surface 200US of the second semiconductor chip 200. In an embodiment, the upper surface 300US of the first dummy chip 300 may refer to an upper surface 300US of a first dummy chip 300 having the greatest height among a plurality of first dummy chips 300. For example, the filling insulating film 400 may cover all of the upper surfaces of the plurality of first dummy chips 300.

The second dummy chip 500 may be disposed on the filling insulating film 400. The second dummy chip 500 may be disposed on the upper surface 400US of the filling insulating film 400. The second dummy chip 500 may be a semiconductor substrate that does not include a circuit layer. In an embodiment, the second dummy chip 500 may be, for example, bulk silicon or silicon-on-insulator (SOI). In an embodiment, the second dummy chip 500 may be a silicon substrate or may include other materials, for example, silicon germanium, indium antimonide, a lead tellurium compound, indium arsenide, indium phosphide, gallium arsenide, or gallium antimonide. However, embodiments of the present disclosure are not necessarily limited thereto. For example, in an embodiment the second dummy chip 500 may be a substrate in which an epitaxial layer is formed on a base substrate.

The second dummy bonding insulating film 510 may be disposed between the second dummy chip 500 and the filling insulating film 400 (e.g., in the second direction DR2). In an embodiment, the second dummy bonding insulating film 510 may include, for example, at least one compound selected from SiO, SiN, SiCN, SiOC, SiON, and SiOCN. However, embodiments of the present disclosure are not necessarily limited thereto.

The second dummy bonding insulating film 510 may be bonded to the filling insulating film 400. In an embodiment, the second dummy bonding insulating film 510 and the filling insulating film 400 may be bonded to each other by a dielectric-dielectric bonding method. For example, the second dummy bonding insulating film 510 may be attached to the filling insulating film 400.

FIGS. 2 to 6 are views for describing semiconductor packages according to some embodiments. For convenience of explanation, contents different from those described with reference to FIG. 1 will be mainly described and a repeated description of identical or similar elements may be omitted for economy of description.

Figure 2:
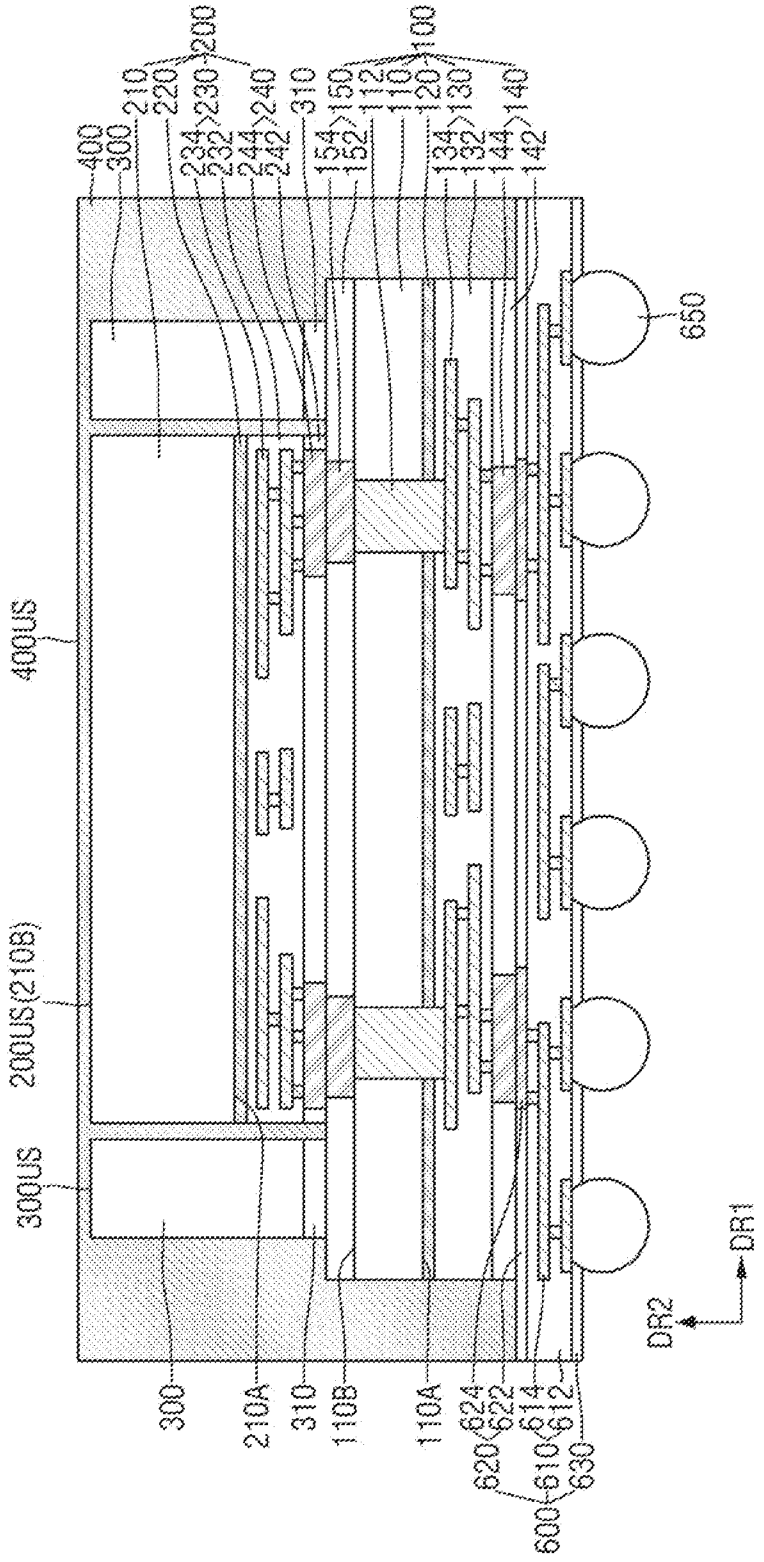
FIGS. 2 to 6 are cross-sectional views for describing semiconductor packages according to some embodiments.

Referring to FIG. 2, a semiconductor package according to some embodiments may include a first semiconductor chip 100, a second semiconductor chip 200, first dummy chips 300, a filling insulating film 400, a redistribution substrate 600, and connection terminals 650. The semiconductor package illustrated in an embodiment of FIG. 2 may not include the second dummy chip 500 and the second dummy bonding insulating film 510 as compared with an embodiment of the semiconductor package described with reference to FIG. 1.

Figure 3:
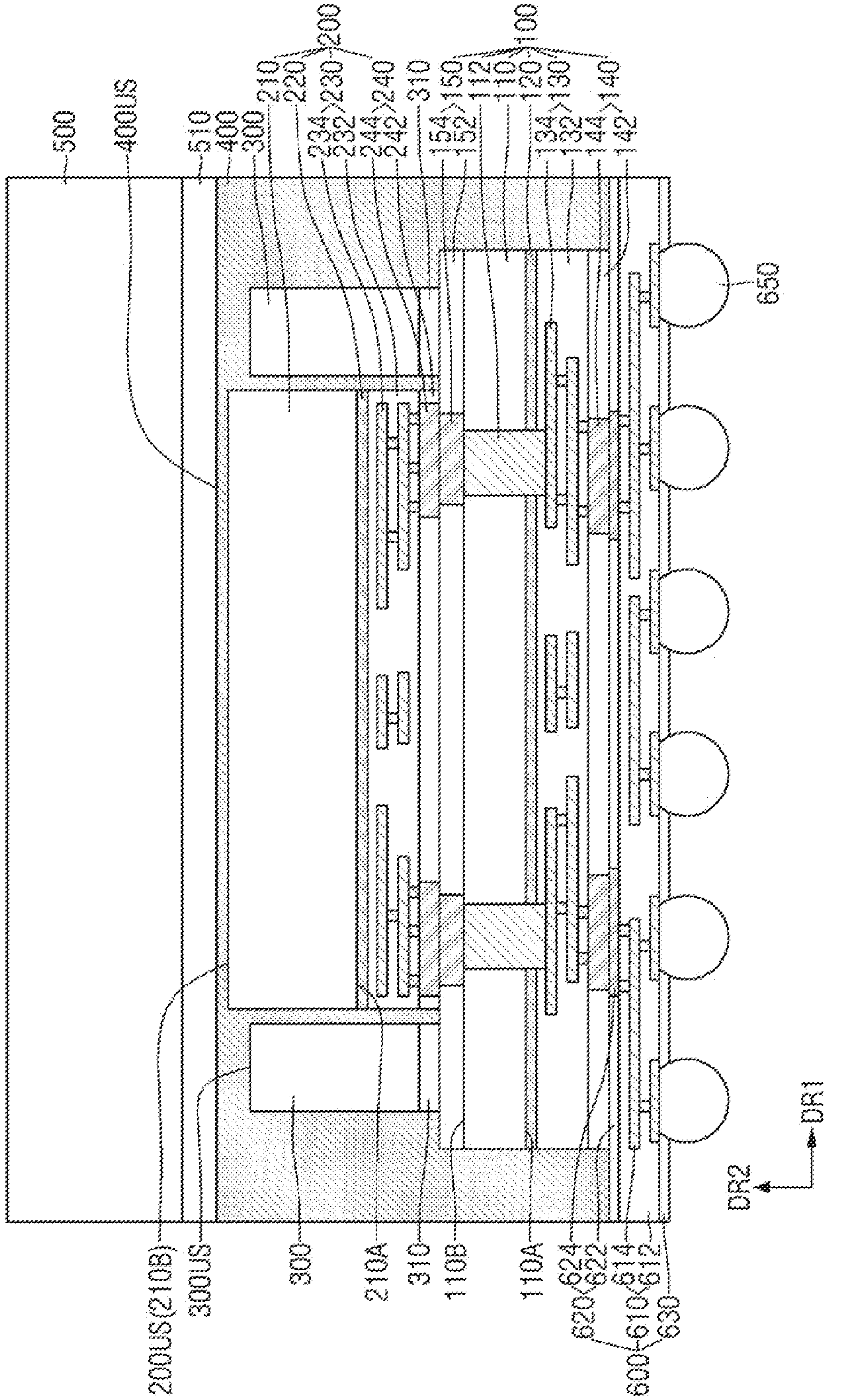

Referring to FIG. 3, in a semiconductor package according to some embodiments, an upper surface 300US of the first dummy chip 300 may be disposed on a different plane from an upper surface 200US of the second semiconductor chip 200. A thickness of the filling insulating film 400 on the upper surface 300US of the first dummy chip 300 may be different from a thickness of the filling insulating film 400 on the upper surface 200US of the second semiconductor chip 200. For example, as shown in an embodiment of FIG. 3, the thickness (e.g., length in the second direction DR2) of the filling insulating film 400 on the upper surface 300US of the first dummy chip 300 may be greater than the thickness (e.g., length in the second direction DR2) of the filling insulating film 400 on the upper surface 200US of the second semiconductor chip 200. However, embodiments of the present disclosure are not necessarily limited thereto. For example, thicknesses of the first dummy chip 300 in the second direction DR2 may vary.

As an example, the upper surface 300US of the first dummy chip 300 may be disposed on a level below the upper surface 200US of the second semiconductor chip 200. As another example, the upper surface 300US of the first dummy chip 300 may be disposed on a level above the upper surface 200US of the second semiconductor chip 200. The filling insulating film 400 may cover the upper surface 300US of the first dummy chip 300 and the upper surface 200US of the second semiconductor chip 200.

Figure 4:
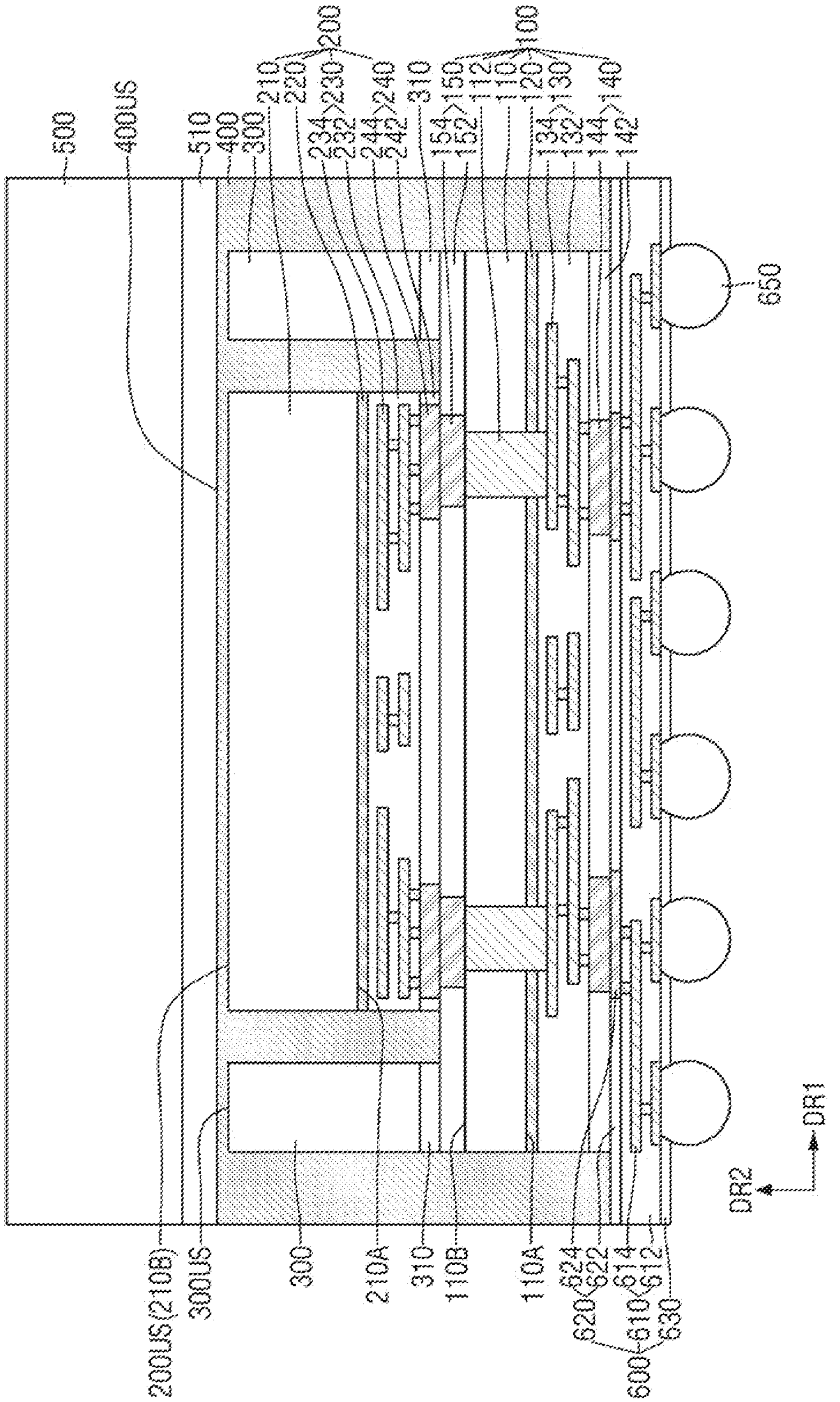

Referring to FIG. 4, in the semiconductor package according to some embodiments, one sidewall of the first dummy chip 300 may be disposed on substantially the same plane as one sidewall of the first semiconductor chip 100. For example, one sidewall of the first dummy chip 300 in the first direction DR1 may be disposed on substantially the same plane as one sidewall of the first semiconductor chip 100 in the first direction DR1. The one sidewall of the first dummy chip 300 may be aligned with the one sidewall of the first semiconductor chip 100 in the second direction DR2. A thickness of the filling insulating film 400 on the sidewall of the first dummy chip 300 may be substantially the same as a thickness of the filling insulating film 400 on the sidewall of the first semiconductor chip 100. The thickness may be based on the first direction DR1.

Figure 5:
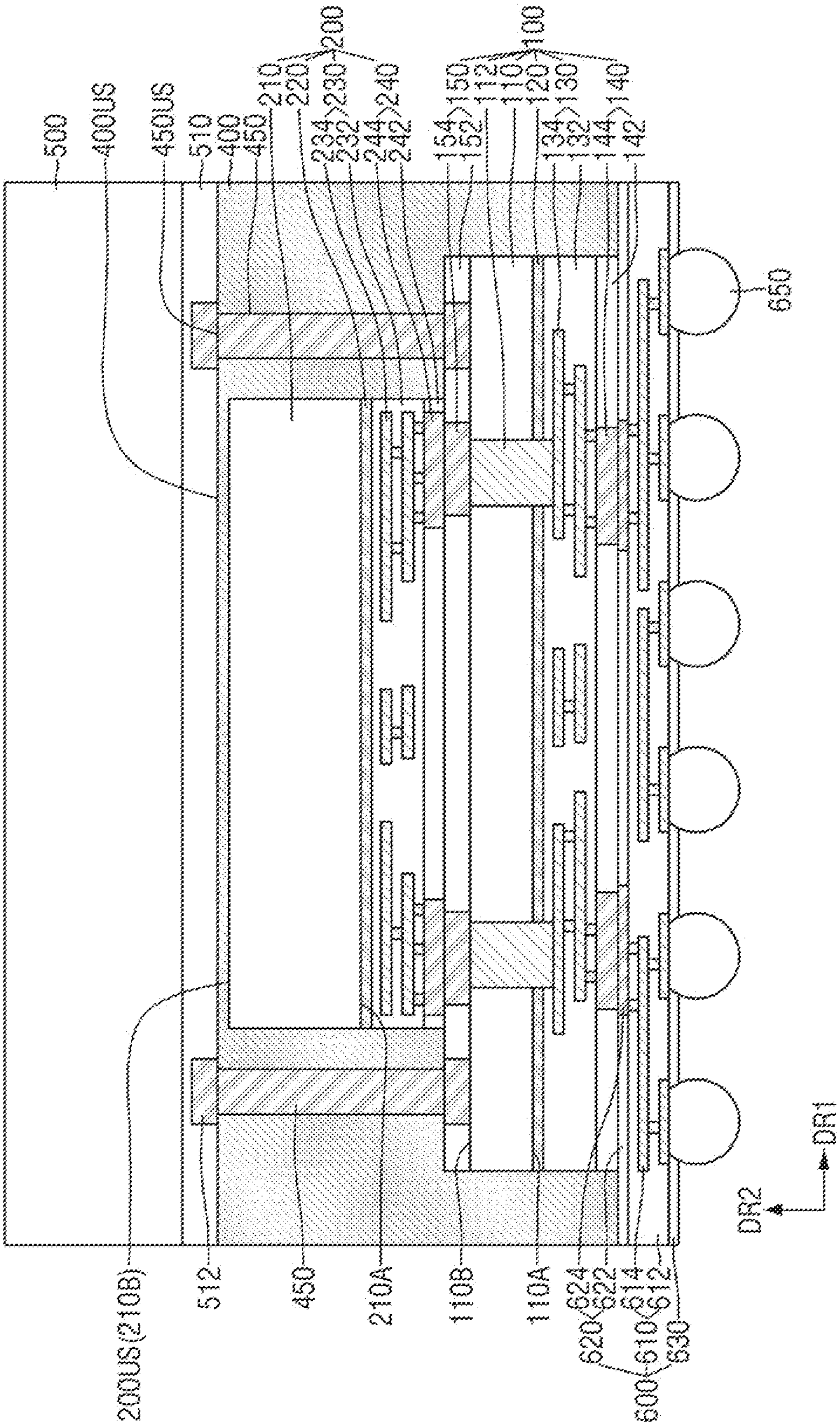

Referring to FIG. 5, a semiconductor package according to some embodiments may include a first semiconductor chip 100, a second semiconductor chip 200, a filling insulating film 400, pillars 450, a second dummy chip 500, a second dummy bonding insulating film 510, dummy bonding pads 512, a redistribution substrate 600, and connection terminals 650.

The pillars 450 may be disposed on (e.g., disposed directly thereon) the first semiconductor chip 100. The pillars 450 may penetrate through the filling insulating film 400. The pillars 450 may penetrate through the filling insulating film 400 from an upper surface 400US of the filling insulating film 400 and be disposed on (e.g., disposed directly thereon) the first-second bonding layer 150 of the first semiconductor chip 100. In an embodiment, an upper surface 450US of the pillar 450 may be disposed on substantially the same plane as the upper surface 400US of the filling insulating film 400. This may result from a process of forming the filling insulating film 400 covering the first and second semiconductor chips 100 and 200 on the redistribution substrate 600, forming trenches exposing at least portions of an upper surface of the first semiconductor chip 100, and then forming the pillars 450 filling the trenches. The filling insulating film 400 may be in direct contact with the first-second bonding pads 154 disposed in the first-second bonding layer 150.

The dummy bonding pads 512 may be disposed in the second dummy bonding insulating film 510. The pillars 450 may be in direct contact with the dummy bonding pads 512. In an embodiment, the dummy bonding pad 512 may include a metal, for example, copper (Cu), aluminum (Al), or tungsten (W), but is not limited thereto.

The second dummy bonding insulating film 510 may be attached to the filling insulating film 400, and the pillars 450 may be attached to the dummy bonding pads 512. For example, in an embodiment the filling insulating film 400 and the pillars 450, and the second dummy bonding insulating film 510 and the dummy bonding pads 512 may be bonded to each other by a hybrid bonding method. For example, in an embodiment the pillars 450 and the dummy bonding pads 512 may be bonded to each other by a copper (Cu)-copper (Cu) bonding method, and the filling insulating film 400 and the second dummy bonding insulating film 510 may be bonded to each other by a dielectric-dielectric bonding method.

Figure 6:
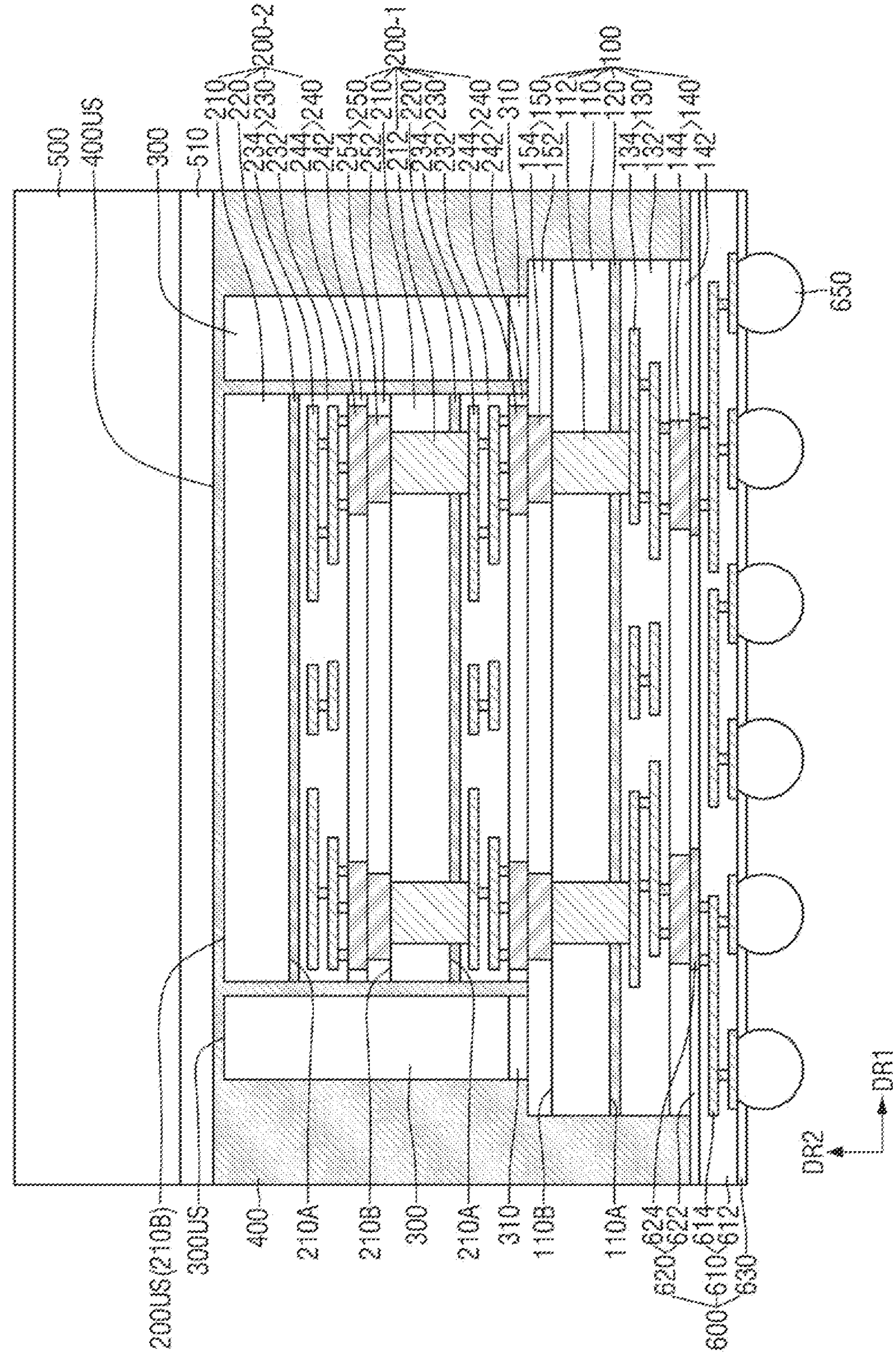

Referring to FIG. 6, a semiconductor package according to some embodiments may include a first semiconductor chip 100, a second-first semiconductor chip 200-1, a second-second semiconductor chip 200-2, first dummy chips 300, a first dummy bonding insulating film 310, a filling insulating film 400, a second dummy chip 500, a second dummy bonding insulating film 510, a redistribution substrate 600, and connection terminals 650.

The second-first semiconductor chip 200-1 may include a second semiconductor substrate 210, second-first through vias 212, a second semiconductor element layer 220, a second chip wiring layer 230, a second-first bonding layer 240, and a second-second bonding layer 250.

The second-first through vias 212 may penetrate through the second semiconductor substrate 210 and the second semiconductor element layer 220. For example, the second-first through vias 212 may be in direct contact with second chip wiring patterns 234 disposed at the uppermost portion among second chip wiring patterns 234. Accordingly, the second-first through vias 212 may be electrically connected to the second-first semiconductor chip 200-1.

The second-first through via 212 may include, for example, a conductive film penetrating through the second semiconductor substrate 210 and having a pillar shape and a barrier film interposed between the conductive film and the second semiconductor substrate 210. In an embodiment, the conductive film of the second-first through via 212 may include, for example, at least one of Cu alloys such as Cu, CuSn, CuMg, CuNi, CuZn, CuPd, CuAu, CuRe, and CuW, W, W alloys, Ni, Ru, and Co. However, embodiments of the present disclosure are not necessarily limited thereto. In an embodiment, the barrier film of the second-first through via 212 may be, for example, at least one compound selected from titanium (Ti), titanium nitride (TiN), tantalum (Ta), tantalum nitride (TaN), rubidium (Ru), cobalt (Co), manganese (Mn), tungsten nitride (WN), nickel (Ni), and nickel boride (NiB). However, embodiments of the present disclosure are not necessarily limited thereto.

The second-first through via 212 may further include, for example, an insulating film interposed between the barrier film and the second semiconductor substrate 210. In an embodiment, the insulating film of the second-first through via 212 may include, for example, at least one material selected from an oxide film, a nitride film, a carbide film, a polymer, or combinations thereof. However, embodiments of the present disclosure are not necessarily limited thereto.

The second-second bonding layer 250 may be disposed on (e.g., disposed directly thereon) a fourth surface 210B of the second semiconductor substrate 210 of the second-first semiconductor chip 200-1. The second-second bonding layer 250 may include, for example, a second-second bonding insulating film 252 and second-second bonding pads 254 disposed in the second-second bonding insulating film 252. The second-second bonding pads 254 may be in direct contact with the second-first through vias 212. Accordingly, the second-second bonding pads 254 may be electrically connected to the second-first semiconductor chip 200-1.

In an embodiment, the second-second bonding pad 254 may include a metal, for example, copper (Cu), aluminum (Al), or tungsten (W). However, embodiments of the present disclosure are not necessarily limited thereto. In an embodiment, the second-second bonding insulating film 252 may include an insulating material, for example, at least one compound selected from SiO, SiN, SiCN, SiOC, SiON, and SiOCN. However, embodiments of the present disclosure are not necessarily limited thereto.

The second-second semiconductor chip 200-2 may be disposed on (e.g., disposed directly thereon) the second-first semiconductor chip 200-1. The second-second semiconductor chip 200-2 may include a second semiconductor substrate 210, a second semiconductor element layer 220, a second chip wiring layer 230, and a second-first bonding layer 240.

A third surface 210A of the second semiconductor substrate 210 of the second-second semiconductor chip 200-2 may face the fourth surface 210B of the second semiconductor substrate 210 of the second-first semiconductor chip 200-1. The second semiconductor element layer 220 of the second-second semiconductor chip 200-2 may be disposed on (e.g., disposed directly thereon) the third surface 210A of the second semiconductor substrate 210 of the second-second semiconductor chip 200-2, and the second semiconductor element layer 220 of the second-first semiconductor chip 200-1 may be disposed on (e.g., disposed directly thereon) a third surface 210A of the second semiconductor substrate 210 of the second-first semiconductor chip 200-1.

The second-second bonding layer 250 of the second-first semiconductor chip 200-1 may be bonded to the second-first bonding layer 240 of the second-second semiconductor chip 200-2. The second-first semiconductor chip 200-1 may be electrically connected to the second-second semiconductor chip 200-2.

In an embodiment, the second-second bonding layer 250 of the second-first semiconductor chip 200-1 and the second-first bonding layer 240 of the second-second semiconductor chip 200-2 may be bonded to each other by a hybrid bonding method. For example, the second-second bonding pads 254 of the second-first semiconductor chip 200-1 may be attached to second-first bonding pads 244 of the second-second semiconductor chip 200-2, and the second-second bonding insulating film 252 of the second-first semiconductor chip 200-1 may be attached to a second-first bonding insulating film 242 of the second-second semiconductor chip 200-2. For example, in an embodiment the second-second bonding pads 254 of the second-first semiconductor chip 200-1 and the second-first bonding pads 244 of the second-second semiconductor chip 200-2 may be bonded to each other by a copper (Cu)-copper (Cu) bonding method, and the second-second bonding insulating film 252 of the second-first semiconductor chip 200-1 and the second-first bonding insulating film 242 of the second-second semiconductor chip 200-2 may be bonded to each other by a dielectric-dielectric bonding method.

In an embodiment, the second-first semiconductor chip 200-1 and the second-second semiconductor chip 200-2 may be the same type of semiconductor chips. For example, the second-first semiconductor chip 200-1 and the second-second semiconductor chip 200-2 may be memory semiconductor chips. However, embodiments of the present disclosure are not necessarily limited thereto.

The second-first semiconductor chip 200-1 and the second-second semiconductor chip 200-2 may be disposed between the first dummy chips 300 adjacent to each other (e.g., in the first direction DR1).

The filling insulating film 400 may cover the first semiconductor chip 100, the second-first semiconductor chip 200-1, the second-second semiconductor chip 200-2, and the first dummy chips 300, on the redistribution substrate 600. The filling insulating film 400 may cover a portion of an upper surface of the redistribution substrate 600, a portion of an upper surface and sidewalls of the first semiconductor chip 100, sidewalls of the second-first semiconductor chip 200-1, an upper surface and sidewalls of the second-second semiconductor chip 200-2, upper surfaces and sidewalls of the first dummy chips 300, and sidewalls of the first dummy bonding insulating film 310. The filling insulating film 400 may fill spaces between the first dummy chips 300, and the second-first semiconductor chip 200-1 and the second-second semiconductor chip 200-2.

An upper surface 400US of the filling insulating film 400 may be disposed on a level above an upper surface 300US of the first dummy chip 300 and an upper surface 200US of the second-second semiconductor chip 200-2. The upper surface 200US of the second-second semiconductor chip 200-2 may be a fourth surface 210B of the second semiconductor substrate 210 of the second-second semiconductor chip 200-2.

Figure 7:
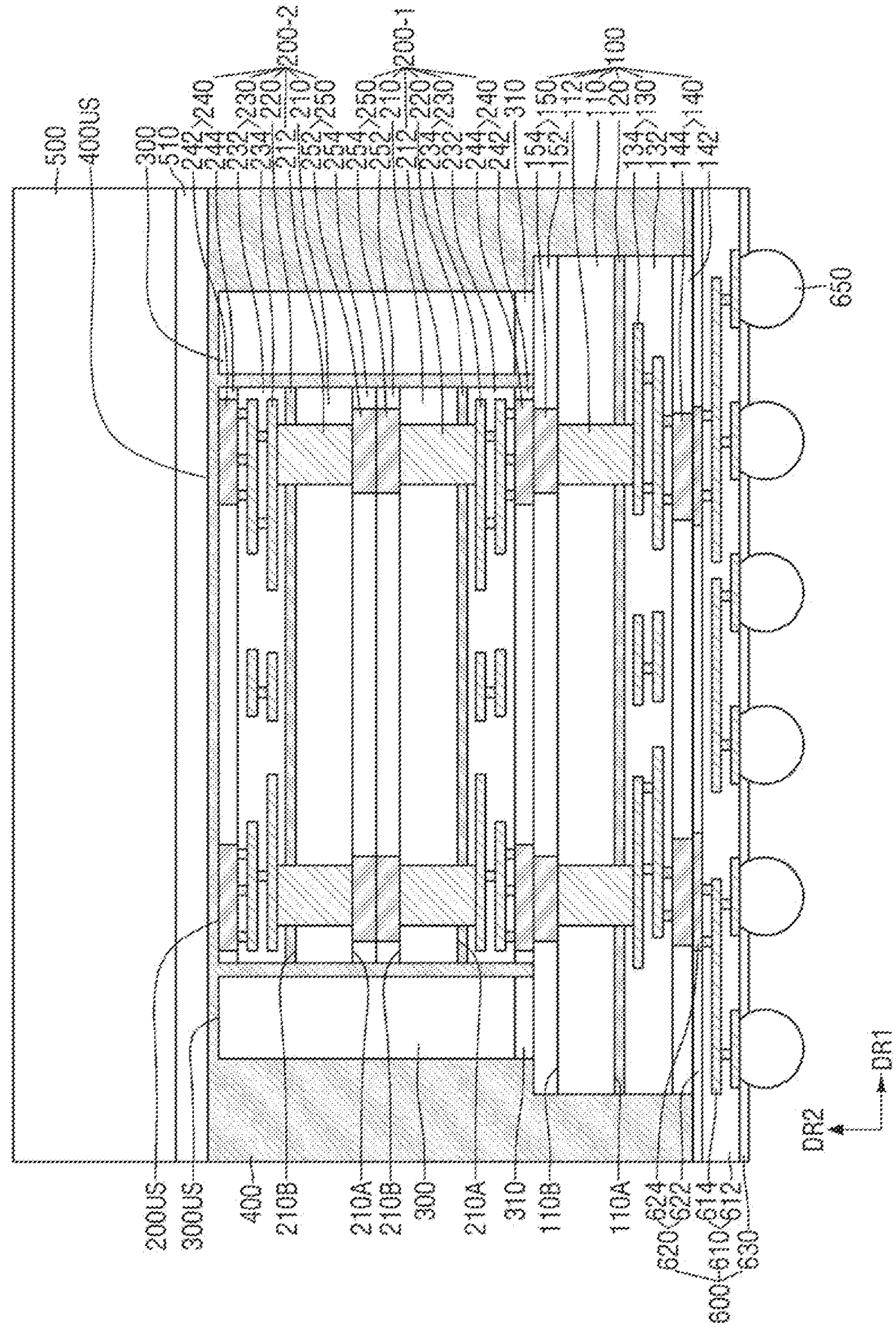
FIGS. 7 and 8 are cross-sectional views for describing semiconductor packages according to some embodiments.
Figure 8:
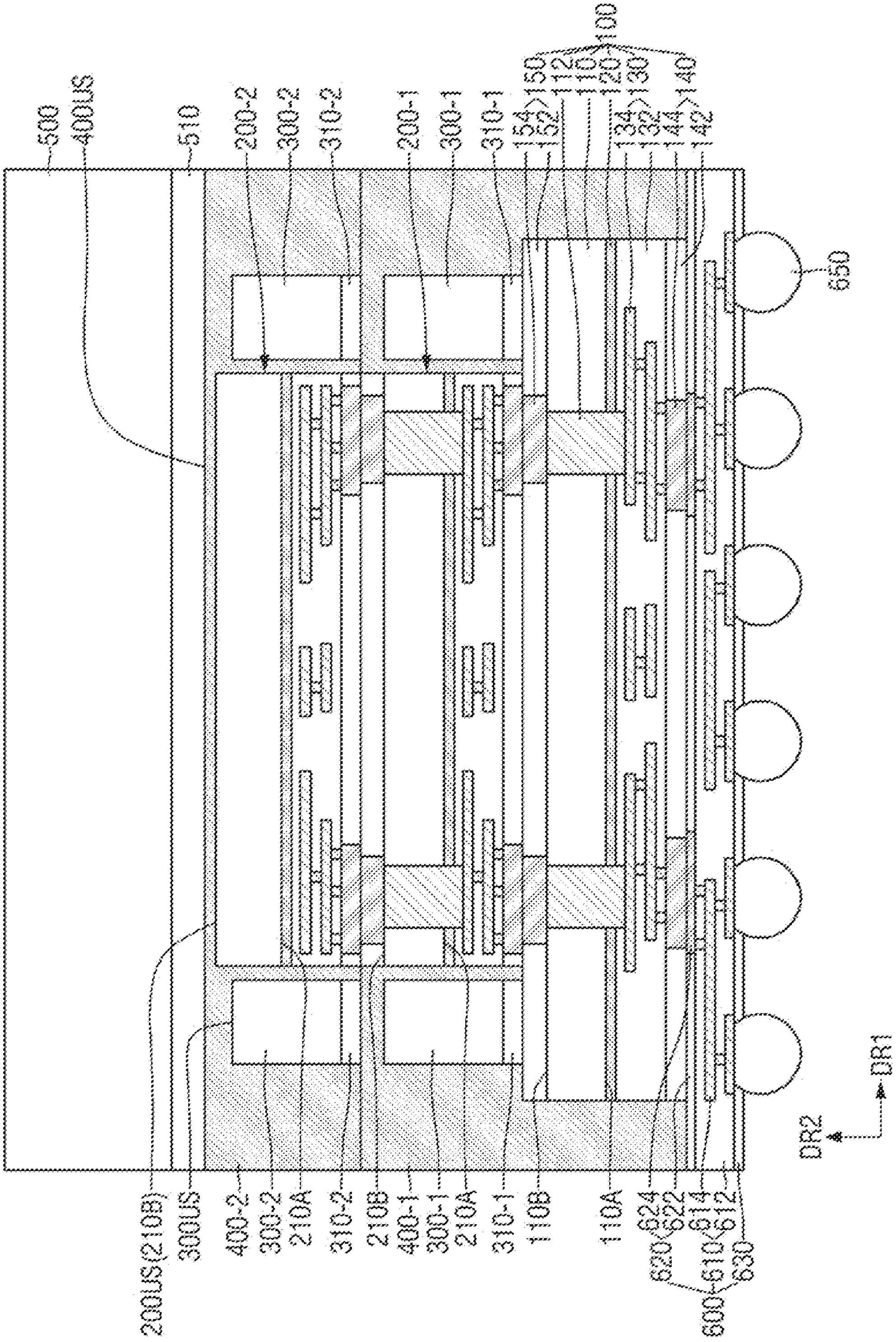

FIGS. 7 and 8 are views for describing semiconductor packages according to some embodiments. For convenience of explanation, contents different from those described with reference to FIGS. 1 to 6 will be mainly described and a repeated description of identical or similar elements may be omitted for economy of description.

Referring to FIG. 7, in a second-second semiconductor chip 200-2 of a semiconductor package according to some embodiments, a second semiconductor element layer 220 may be disposed on the fourth surface 210B of the second semiconductor substrate 210, and a second-second bonding layer 250 may be disposed on (e.g., disposed directly thereon) the third surface 210A of the second semiconductor substrate 210. In a second-first semiconductor chip 200-1, a second semiconductor element layer 220 may be disposed on (e.g., disposed directly thereon) the third surface 210A of the second semiconductor substrate 210.

An upper surface 400US of the filling insulating film 400 may be disposed on a level above an upper surface 300US of the first dummy chip 300 and an upper surface 200US of the second-second semiconductor chip 200-2. The upper surface 200US of the second-second semiconductor chip 200-2 may be an upper surface of the second-first bonding layer 240 of the second-second semiconductor chip 200-2.

Referring to FIG. 8, in a semiconductor package according to some embodiments, first-first dummy chips 300-1 may be disposed on the first semiconductor chip 100. The second-first semiconductor chip 200-1 may be disposed between the first-first dummy chips 300-1 on the first semiconductor chip 100 (e.g., in the first direction DR1).

A first-second dummy bonding insulating film 310-2 may be bonded to a first filling insulating film 400-1. In an embodiment, the first-second dummy bonding insulating film 310-2 and the first filling insulating film 400-1 may be bonded to each other by a dielectric-dielectric bonding method. For example, the first-second dummy bonding insulating film 310-2 may be attached to the first filling insulating film 400-1.

The first filling insulating film 400-1 may cover at least portions of the first semiconductor chip 100, the second-first semiconductor chip 200-1, and the first-first dummy chips 300-1, on the redistribution substrate 600. The first filling insulating film 400-1 may cover a portion of an upper surface of the redistribution substrate 600, a portion of an upper surface and sidewalls of the first semiconductor chip 100, sidewalls of the second-first semiconductor chip 200-1, upper surfaces and sidewalls of the first-first dummy chips 300-1, and sidewalls of the first-first dummy bonding insulating film 310-1. The first filling insulating film 400-1 may fill spaces between the first-first dummy chips 300-1 and the second-first semiconductor chip 200-1. The first filling insulating film 400-1 may expose an upper surface of the second-first semiconductor chip 200-1, and may cover upper surfaces of the first-first dummy chips 300-1.

The upper surface of the second-first semiconductor chip 200-1 may be disposed on a level above the upper surfaces of the first-first dummy chips 300-1, and may be disposed on substantially the same plane as an upper surface of the first filling insulating film 400-1.

First-second dummy chips 300-2 may be disposed on the first filling insulating film 400-1. The second-second semiconductor chip 200-2 may be disposed between the first-second dummy chips 300-2 (e.g., in the first direction DR1).

A second filling insulating film 400-2 may cover the second-second semiconductor chip 200-2 and the first-second dummy chips 300-2, on the first filling insulating film 400-1. The second filling insulating film 400-2 may cover a portion of the upper surface of the first filling insulating film 400-1, an upper surface 200US and sidewalls of the second-second semiconductor chip 200-2, an upper surface 300US and sidewalls of the first-second dummy chip 300-2, and sidewalls of the first-second dummy bonding insulating film 310-2. The second filling insulating film 400-2 may fill spaces between the first-second dummy chips 300-2 and the second-second semiconductor chip 200-2. The second filling insulating film 400-2 may cover both the upper surface 200US of the second-second semiconductor chip 200-2 and the upper surface 300US of the first-second dummy chip 300-2.

An upper surface 400US of the second filling insulating film 400-2 may be disposed on a level above the upper surface 300US of the first-second dummy chip 300-2 and the upper surface 200US of the second-second semiconductor chip 200-2. The upper surface 200US of the second-second semiconductor chip 200-2 may be a fourth surface 210B of the second semiconductor substrate 210 of the second-second semiconductor chip 200-2. In an embodiment, the thickness (e.g., length in the second direction DR2) of the second filling insulating film 400-2 on the upper surface 200US of the second-second semiconductor chip 200-2 may be less than the thickness (e.g., length in the second direction DR2) of the second filling insulating film 400-2 on the upper surface 300US of the first-second dummy chip 300-2.

FIGS. 9 to 15 are intermediate step drawings for describing a method for fabricating a semiconductor package according to some embodiments.

Figure 9:
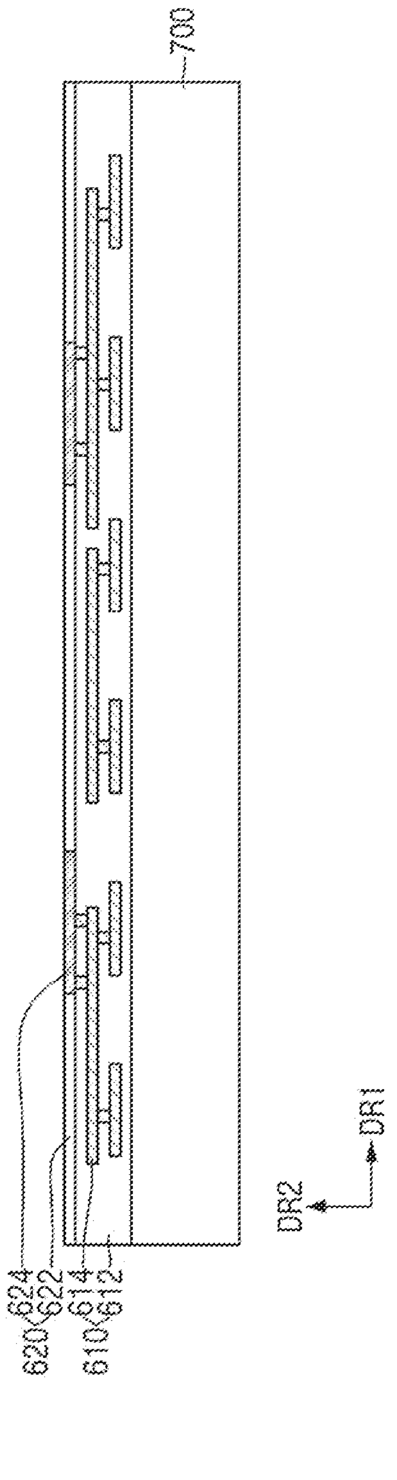
FIGS. 9 to 15 are intermediate step drawings for describing a method for fabricating a semiconductor package according to some embodiments.

Referring to FIG. 9, the redistribution layer 610 and the substrate bonding layer 620 may be sequentially formed on a carrier 700. The redistribution layer 610 may be formed by repeatedly performing a process of forming and patterning the redistribution insulating film 612 on the carrier 700 and a process of forming the redistribution patterns 614 on the patterned redistribution insulating film 612. The substrate bonding layer 620 may be formed by performing a process of forming and patterning the substrate bonding insulating film 622 on the redistribution layer 610 and a process of forming the substrate bonding pads 624 on the patterned substrate bonding insulating film 622.

In an embodiment, the carrier 700 may include, for example, silicon, metal, glass, plastic, ceramic, or the like.

Figure 10:
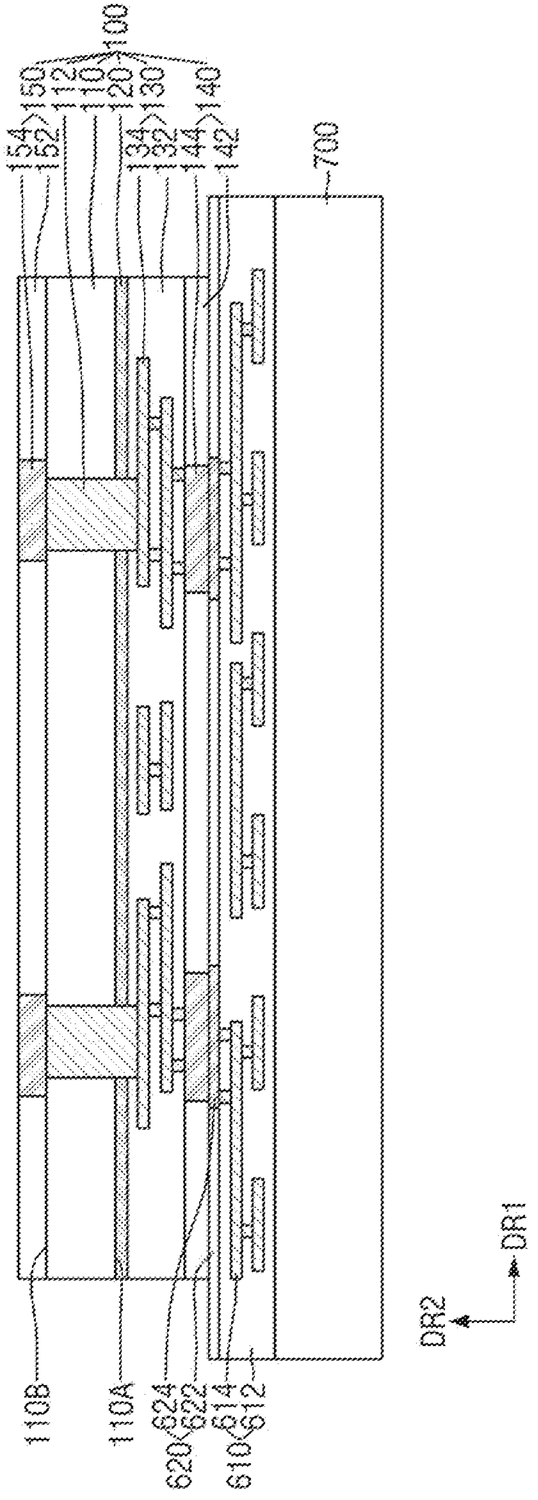

Referring to FIG. 10, the first semiconductor element layer 120, the first chip wiring layer 130, and the first-first bonding layer 140 may be sequentially formed on the first surface 110A of the first semiconductor substrate 110, and the first-second bonding layer 150 may be formed on the second surface 110B of the first semiconductor substrate 110. For example, the first semiconductor chip 100 on which the first-first bonding layer 140 is formed on the first surface 110A of the first semiconductor substrate 110 and the first-second bonding layer 150 is formed on the second surface 110B of the first semiconductor substrate 110 may be provided.

The first semiconductor chip 100 may be mounted on the substrate bonding layer 620. The first semiconductor chip 100 may be mounted on the substrate bonding layer 620 so that the first surface 110A of the first semiconductor substrate 110 on which the first semiconductor element layer 120 is formed faces the substrate bonding layer 620.

The first-first bonding layer 140 of the first semiconductor chip 100 may be bonded to the substrate bonding layer 620. The first-first bonding insulating film 142 may be bonded to the substrate bonding insulating film 622, and the first-first bonding pads 144 may be bonded to the substrate bonding pads 624. Accordingly, the first semiconductor chip 100 may be bonded to the substrate bonding layer 620.

Figure 11:
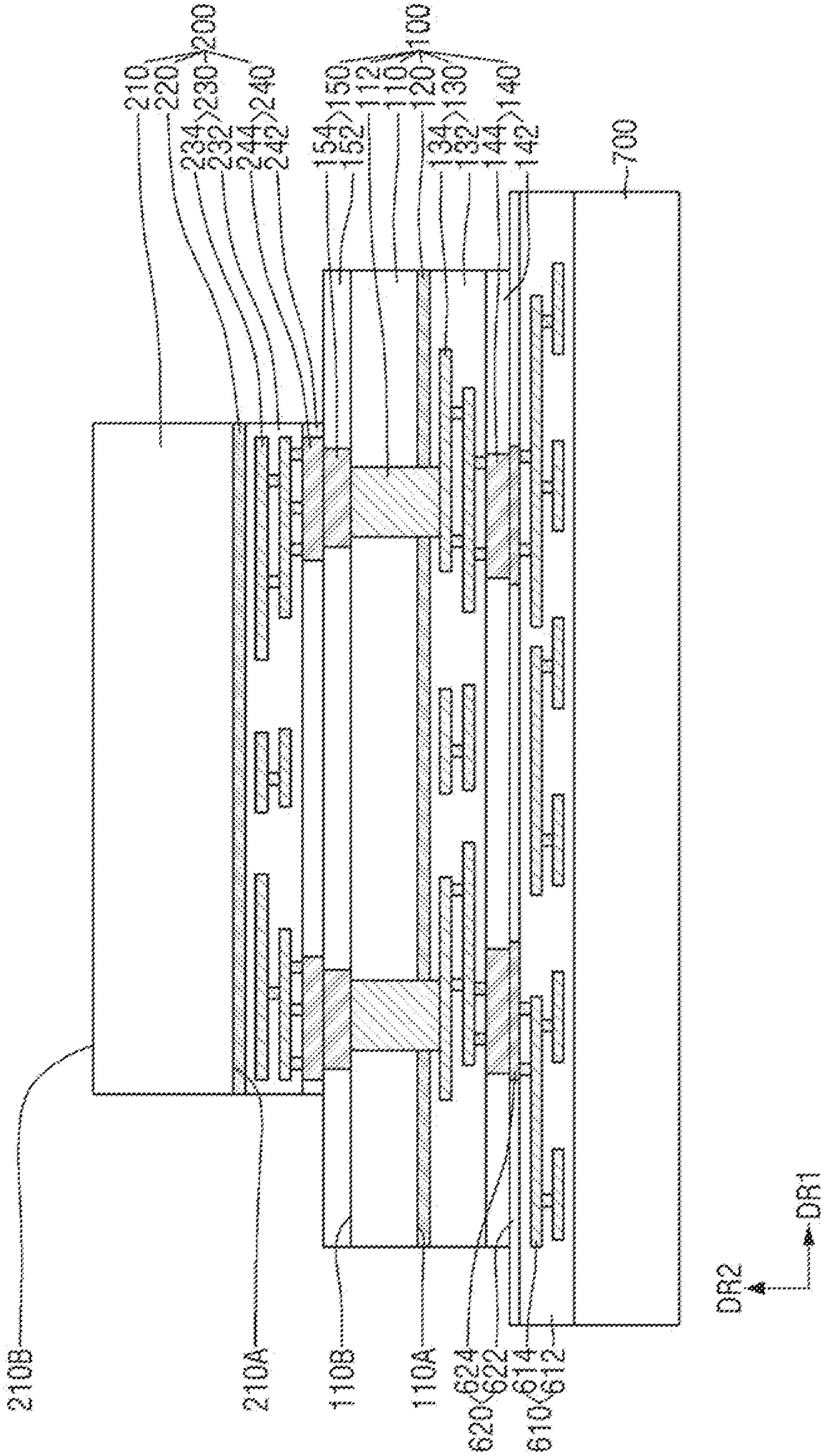

Referring to FIG. 11, the second semiconductor element layer 220, the second chip wiring layer 230, and the second-first bonding layer 240 may be sequentially formed on the third surface 210A of the second semiconductor substrate 210.

The second semiconductor chip 200 may be mounted on the first semiconductor chip 100. The second semiconductor chip 200 may be mounted on the first semiconductor chip 100 so that the third surface 210A of the second semiconductor substrate 210 on which the second semiconductor element layer 220 is formed faces the first semiconductor chip 100.

The second-first bonding layer 240 of the second semiconductor chip 200 may be bonded to the first-second bonding layer 150 of the first semiconductor chip 100. The second-first bonding insulating film 242 may be bonded to the first-second bonding insulating film 152, and the second-first bonding pads 244 may be bonded to the first-second bonding pads 154. Accordingly, the second semiconductor chip 200 may be bonded to the first semiconductor chip 100.

Figure 12:
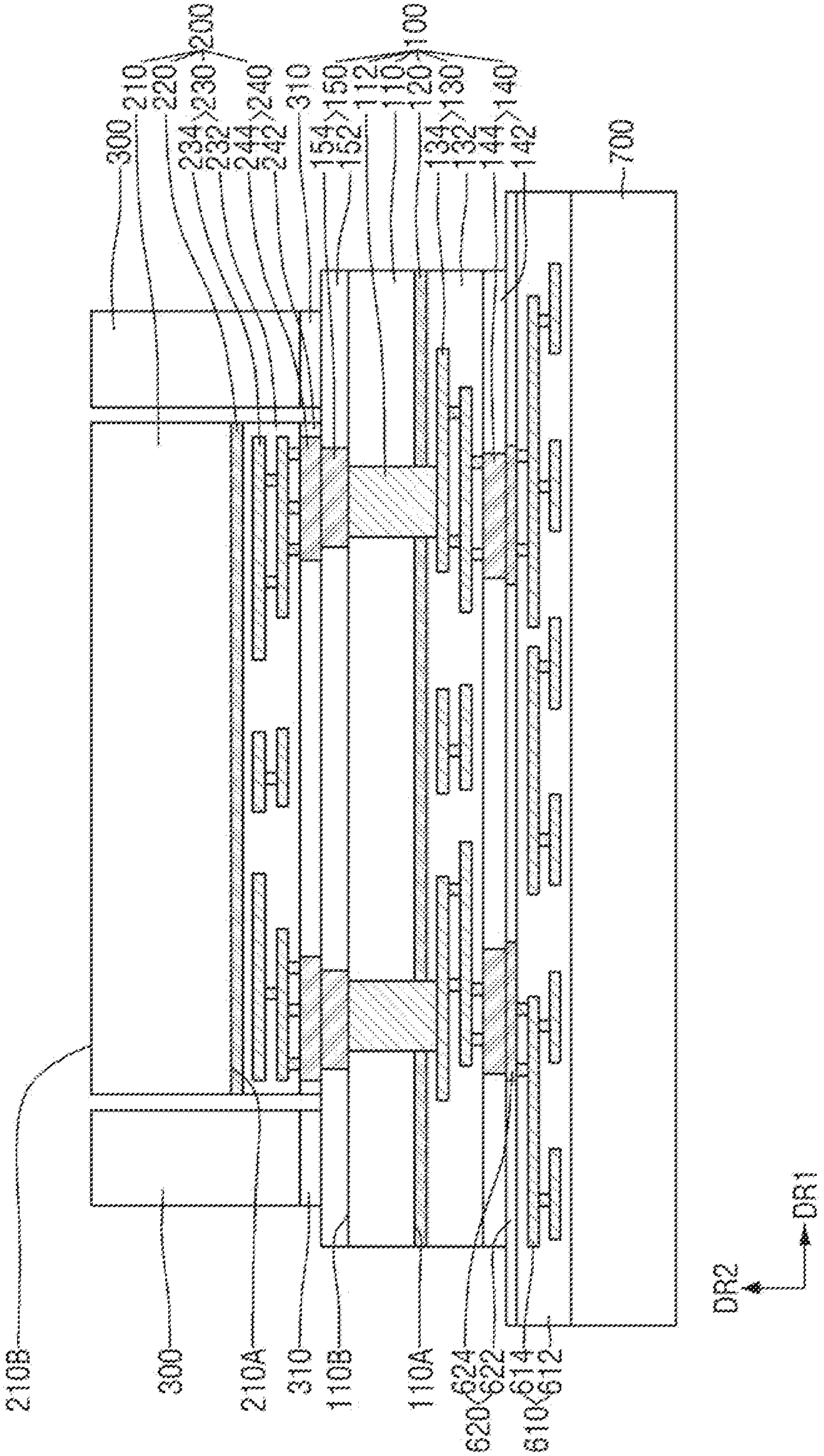

Referring to FIG. 12, the first dummy chips 300 beneath which the first dummy bonding insulating film 310 is formed may be mounted on the first semiconductor chip 100. The first dummy chips 300 may be mounted on the first semiconductor chip 100 so that the first dummy bonding insulating film 310 faces the first semiconductor chip 100. For example, in an embodiment a lower surface of the first dummy bonding insulating film 310 may directly contact an upper surface of the first-second bonding layer 150 of the first semiconductor chip 100.

The first dummy bonding insulating film 310 may be bonded to the first-second bonding layer 150 of the first semiconductor chip 100. For example, the first dummy bonding insulating film 310 may be bonded to the first-second bonding insulating film 152. Accordingly, the first dummy chips 300 may be bonded to the first semiconductor chip 100.

For example, the first dummy chips 300 may be mounted around the second semiconductor chip 200 on the first semiconductor chip 100 (e.g., in the first direction DR1).

Figure 13:
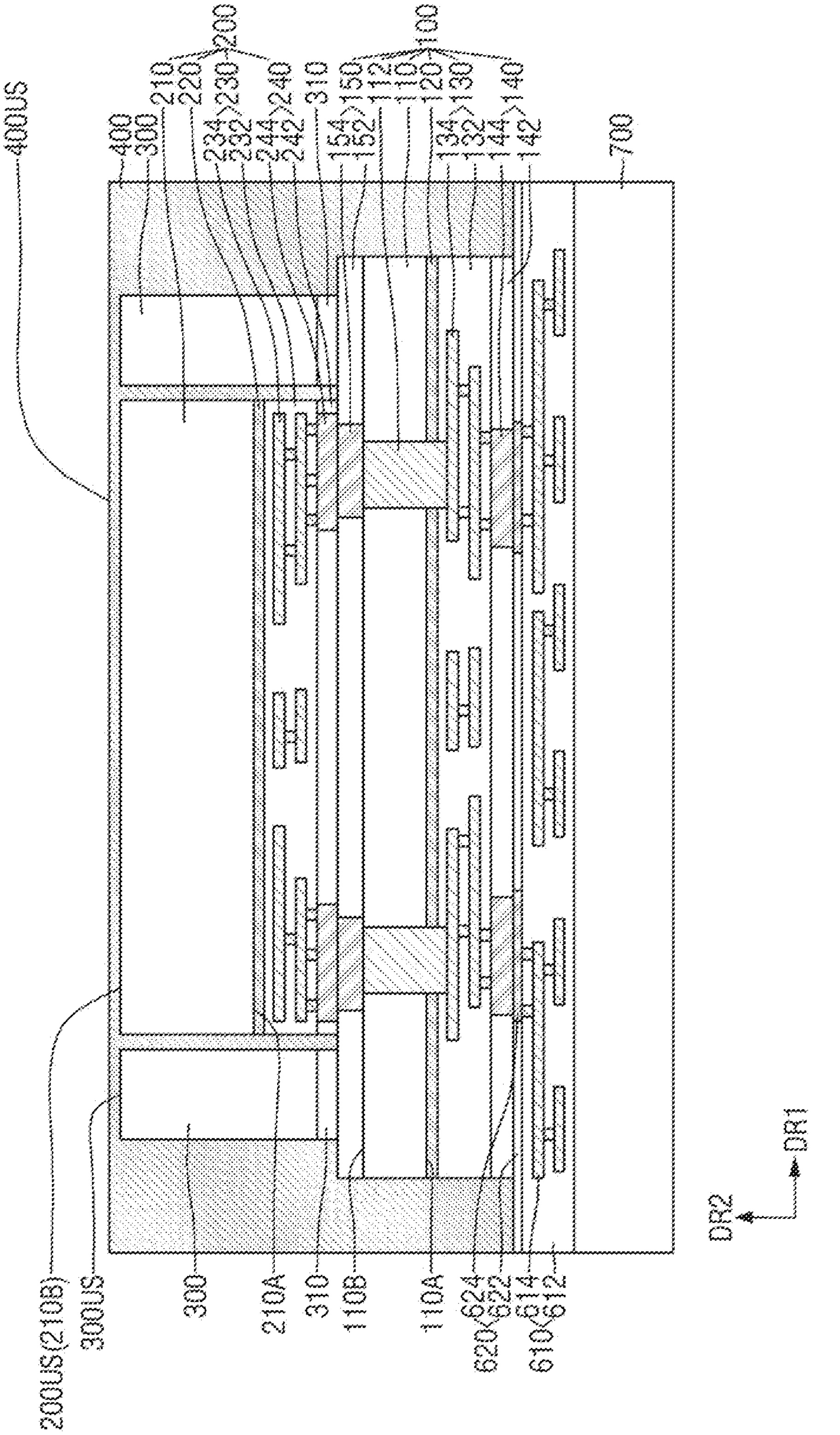

Referring to FIG. 13, the filling insulating film 400 may be formed on the substrate bonding layer 620. The filling insulating film 400 may fill spaces between the second semiconductor chip 200 and the first dummy chips 300. The filling insulating film 400 may cover a portion of an upper surface of the substrate bonding layer 620, a portion of the upper surface and the sidewalls of the first semiconductor chip 100, the upper surface 200US and sidewalls of the second semiconductor chip 200, the upper surface 300US and the sidewalls of the first dummy chips 300, and the sidewalls of the first dummy bonding insulating film 310.

In an embodiment, a planarization process may be performed on the filling insulating film 400, and the upper surface 400US of the filling insulating film 400 may be substantially flat. The upper surface 400US of the filling insulating film 400 may be disposed on a level above the upper surface 300US of the first dummy chip 300 and the upper surface 200US of the second semiconductor chip 200.

In the semiconductor package according to some embodiments, after the first semiconductor chip 100, the second semiconductor chip 200, and the first dummy chips 300 are mounted on the redistribution layer 610, the filling insulating film 400 may be formed. For example, a process of forming the filling insulating film 400 may be performed once to fill spaces between the first semiconductor chip 100, the second semiconductor chip 200, and the first dummy chips 300. Accordingly, as compared with a fabricating process of forming each of the filling insulating film 400 surrounding the first semiconductor chip 100 and the filling insulating film 400 surrounding the second semiconductor chip 200 and the first dummy chips 300, a fabricating process may be simplified and a cost may be decreased.

Figure 14:
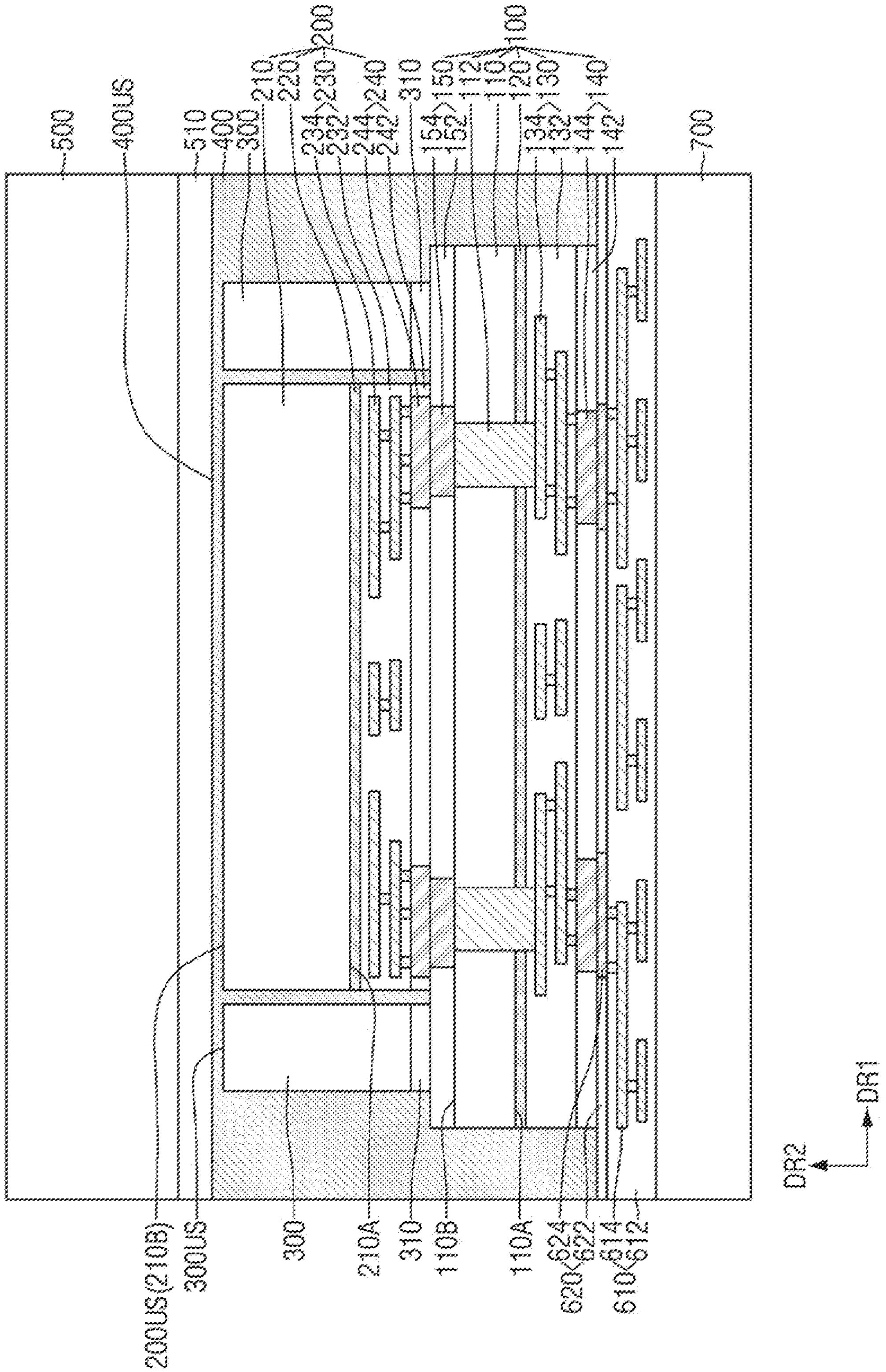

Referring to FIG. 14, the second dummy chip 500 may be mounted on the filling insulating film 400, such as after the planarization process is performed on the filling insulating film 400. For example, the second dummy chip 500 beneath which the second dummy bonding insulating film 510 is formed may be mounted on the filling insulating film 400 so that the second dummy bonding insulating film 510 faces the filling insulating film 400. However, embodiments of the present disclosure are not necessarily limited thereto. For example, in an embodiment the second dummy bonding insulating film 510 may be formed on the filling insulating film 400, and the second dummy chip 500 may be mounted on (e.g., mounted directly thereon) the second dummy bonding insulating film 510.

The second dummy bonding insulating film 510 may be bonded to the filling insulating film 400. Accordingly, the second dummy chip 500 may be bonded to the filling insulating film 400.

Figure 15:
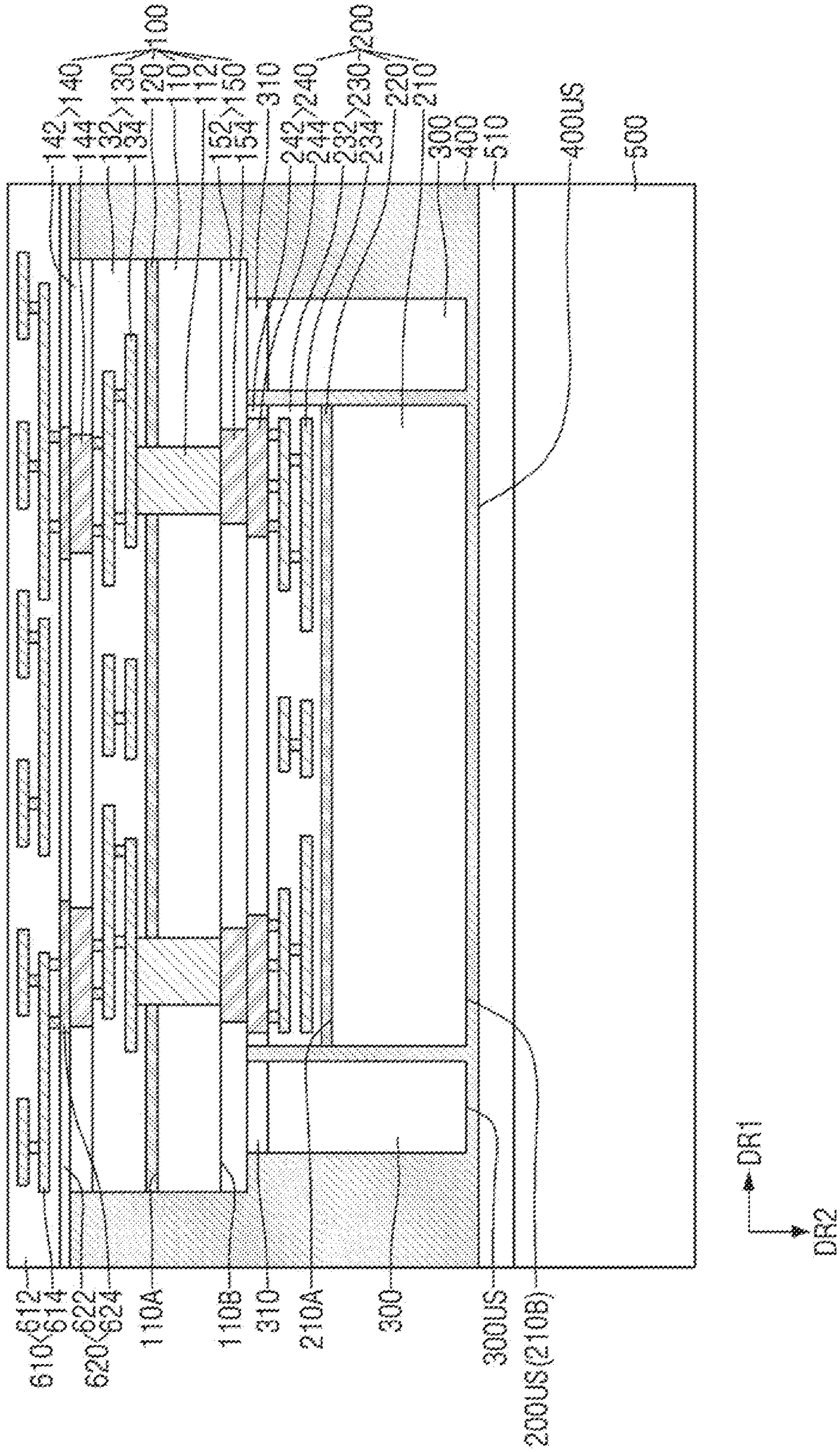

Referring to FIG. 15, the carrier 700 may be removed. Accordingly, the redistribution layer 610 may be exposed.

Referring to FIG. 1, lower surfaces of redistribution patterns 614 disposed at the lowermost portion in the second direction DR2 among the redistribution patterns 614 may then be exposed.

The passivation layer 630 may then be formed on the redistribution insulating film 612. The passivation layer 630 may expose at least portions of the redistribution patterns 614 disposed at the lowermost portion.

The connection terminals 650 may then be formed on the redistribution patterns 614 exposed by the passivation layer 630.

Embodiments of the present disclosure have been described hereinabove with reference to the accompanying drawings. However, embodiments of the present disclosure are not necessarily limited to the above-described embodiments, and may be implemented in various different forms, and one of ordinary skill in the art to which the present disclosure pertains may understand that the present disclosure may be implemented in other specific forms without changing the technical spirit or essential features of the present disclosure. Therefore, it is to be understood that embodiments described above are illustrative rather than being restrictive in all aspects.

What is claimed is:

1. A semiconductor package comprising:

a redistribution substrate;

a first semiconductor chip disposed on the redistribution substrate, the first semiconductor chip including a first semiconductor substrate, first through vias penetrating through the first semiconductor substrate, and a first bonding layer disposed on the first semiconductor substrate, the first bonding layer is electrically connected to the first through vias;

a first dummy chip disposed on the first semiconductor chip;

a first dummy bonding insulating film disposed between the first semiconductor chip and the first dummy chip;

a second semiconductor chip including a second semiconductor substrate and a second bonding layer disposed on the second semiconductor substrate, the second bonding layer is bonded to the first bonding layer; and a filling insulating film disposed on the redistribution substrate, the filling insulating film covering the first semiconductor chip, the first dummy chip, and the second semiconductor chip, wherein an upper surface of the filling insulating film is disposed on a level above an upper surface of the first semiconductor chip, an upper surface of the first dummy chip, and an upper surface of the second semiconductor chip, wherein the first dummy bonding insulating film is bonded to the first bonding layer and to the filling insulating film, wherein a thickness of the filling insulating film on a sidewall of the first dummy chip is greater than a thickness of the filling insulating film on a sidewall of the first semiconductor chip.

2. The semiconductor package of claim 1, wherein:

the first bonding layer includes a first bonding insulating film disposed on the first semiconductor substrate and first bonding pads disposed in the first bonding insulating film;

the second bonding layer includes a second bonding insulating film disposed on the second semiconductor substrate and second bonding pads disposed in the second bonding insulating film;

the first bonding insulating film is bonded to the second bonding insulating film; and the first bonding pads are bonded to the second bonding pads.

3. The semiconductor package of claim 1, further comprising:

a dummy bonding insulating film disposed on the filling insulating film, and a second dummy chip disposed on the dummy bonding insulating film, wherein the dummy bonding insulating film is bonded to the filling insulating film.

4. The semiconductor package of claim 1, wherein the first dummy chip is spaced apart from the second semiconductor chip, and wherein the filling insulating film extends along sidewalls and an upper surface of the first dummy chip.

5. The semiconductor package of claim 4, wherein the sidewalls of the first dummy chip are disposed on the first semiconductor chip.

6. The semiconductor package of claim 4, wherein the upper surface of the second semiconductor chip is disposed on a same plane as the upper surface of the first dummy chip.

7. The semiconductor package of claim 4, wherein the upper surface of the second semiconductor chip is disposed on a different plane from the upper surface of the first dummy chip.

8. The semiconductor package of claim 1, wherein:

the first semiconductor substrate includes a first surface and a second surface opposing each other;

the second semiconductor substrate includes a third surface opposing the second surface and a fourth surface opposing the third surface;

the first semiconductor chip further includes a first semiconductor element layer disposed on the first surface of the first semiconductor substrate and a first chip wiring layer disposed on the first semiconductor element layer, the second semiconductor chip further includes a second semiconductor element layer disposed on the third surface of the second semiconductor substrate and a second chip wiring layer disposed on the second semiconductor element layer, the first bonding layer is disposed on the second surface of the first semiconductor substrate, and the second bonding layer is disposed on the second chip wiring layer.

9. The semiconductor package of claim 1, further comprising a third semiconductor chip disposed on the second semiconductor chip, wherein the filling insulating film covers the third semiconductor chip, the upper surface of the filling insulating film is disposed on a level above an upper surface of the third semiconductor chip, the second semiconductor chip includes a third bonding layer disposed between the second semiconductor substrate and the third semiconductor chip and second through vias penetrating through the second semiconductor substrate, the second through vias are electrically connected to the third bonding layer, and the third semiconductor chip includes a third semiconductor substrate and a fourth bonding layer disposed on the third semiconductor substrate, the fourth bonding layer is bonded to the third bonding layer.

10. The semiconductor package of claim 9, wherein the second semiconductor chip further includes a first semiconductor element layer disposed on a first surface of the second semiconductor substrate and a first chip wiring layer disposed between the first semiconductor element layer and the second bonding layer, and the third semiconductor chip further includes a second semiconductor element layer disposed on a second surface of the third semiconductor substrate facing the first surface of the second semiconductor substrate and a third chip wiring layer disposed between the second semiconductor element layer and the fourth bonding layer.

11. The semiconductor package of claim 9, wherein the second semiconductor chip further includes a first semiconductor element layer disposed on a first surface of the second semiconductor substrate and a first chip wiring layer disposed between the first semiconductor element layer and the second bonding layer, the third semiconductor chip further includes third through vias penetrating through the third semiconductor substrate, the third through vias are disposed on a second surface of the third semiconductor substrate, the third through vias are electrically connected to the fourth bonding layer, a second semiconductor element layer is disposed on a third surface of the third semiconductor substrate, and a second chip wiring layer is disposed on the second semiconductor element layer, and the second surface of the third semiconductor substrate opposes the third surface of the third semiconductor substrate and faces the first surface of the second semiconductor substrate.

12. The semiconductor package of claim 9, further comprising a second dummy chip, wherein the filling insulating film includes a first filling insulating film and a second filling insulating film disposed on the first filling insulating film, the first dummy chip is disposed on the first semiconductor chip, the first dummy chip is spaced apart from the second semiconductor chip, the first filling insulating film is disposed on the redistribution substrate, the first filling insulating film surrounds the first semiconductor chip and the first dummy chip, covers an upper surface of the first dummy chip, and exposes the upper surface of the second semiconductor chip, the second dummy chip is disposed on the first filling insulating film, the second dummy chip is spaced apart from the third semiconductor chip, and the second filling insulating film is disposed on the first filling insulating film, the second filling insulating film surrounds the third semiconductor chip and the second dummy chip, and covers an upper surface of the second dummy chip and the upper surface of the third semiconductor chip.

13. A semiconductor package comprising:

a redistribution substrate;

a first semiconductor chip disposed on the redistribution substrate, the first semiconductor chip including a first semiconductor substrate, first through vias penetrating through the first semiconductor substrate, and a first bonding layer disposed on the first semiconductor substrate, the first bonding layer is electrically connected to the first through vias;

a first-first dummy chip and a first-second dummy chip disposed on the first semiconductor chip, the first-first dummy chip and the first-second dummy chip are spaced apart from each other;

a first dummy bonding insulating film disposed between the first semiconductor chip and the first-first dummy chip and between the first semiconductor chip and the first-second dummy chip, the first dummy bonding insulating film is bonded to the first bonding layer and to a filling insulating film;

a second semiconductor chip disposed on the first semiconductor chip, the second semiconductor chip is positioned between the first-first dummy chip and the first-second dummy chip, the second semiconductor chip including a second semiconductor substrate and a second bonding layer disposed on the second semiconductor substrate, the second bonding layer is bonded to the first bonding layer; and the filling insulating film disposed on the redistribution substrate, the filling insulating film covering the first semiconductor chip, the first-first dummy chip, the first-second dummy chip, and the second semiconductor chip, wherein an upper surface of the filling insulating film is disposed on a level above an upper surface of the first semiconductor chip, an upper surface of the first-first dummy chip, an upper surface of the first-second dummy chip, and an upper surface of the second semiconductor chip, and an entirety of the first-first dummy chip and an entirety of the first-second dummy chip overlap the first semiconductor chip in a direction from the first semiconductor chip towards the second semiconductor chip, wherein a thickness of the filling insulating film on a sidewall of each of the first-first dummy chip and the first-second dummy chip is greater than a thickness of the filling insulating film on a sidewall of the first semiconductor chip.

14. The semiconductor package of claim 13, wherein:

the redistribution substrate includes a redistribution layer and a substrate bonding layer disposed on the redistribution layer;

the first semiconductor chip further includes a third bonding layer disposed on the first semiconductor substrate, the third bonding layer is bonded to the substrate bonding layer; and the semiconductor package further comprising connection terminals disposed on the redistribution substrate, the connection terminals are electrically connected to the redistribution layer.

15. The semiconductor package of claim 14, wherein the substrate bonding layer and the third bonding layer the first bonding layer, and the first bonding layer and the second bonding layer are bonded to each other by a metal-oxide hybrid bonding method.

* * * * *